United States Patent
Takahashi et al.

(10) Patent No.: US 9,842,754 B2
(45) Date of Patent: Dec. 12, 2017

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: HITACHI KOKUSAI ELECTRIC INC., Tokyo (JP)

(72) Inventors: Akira Takahashi, Toyama (JP); Takeshi Yasui, Toyama (JP); Hiroyuki Ogawa, Toyama (JP); Kazuya Nabeta, Toyama (JP); Naoya Matsuura, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 14/839,179

(22) Filed: Aug. 28, 2015

(65) Prior Publication Data

US 2015/0371883 A1 Dec. 24, 2015

Related U.S. Application Data

(63) Continuation of application No. PCT/JP2014/058577, filed on Mar. 26, 2014.

(30) Foreign Application Priority Data

Mar. 28, 2013 (JP) .................. 2013-068318

(51) Int. Cl.
*H01L 21/67* (2006.01)
*H01L 21/68* (2006.01)
(Continued)

(52) U.S. Cl.
CPC .. *H01L 21/67259* (2013.01); *H01L 21/67196* (2013.01); *H01L 21/67748* (2013.01);
(Continued)

(58) Field of Classification Search
CPC ............ H01L 21/67259; H01L 21/681; H01L 21/67196; H01L 21/67748; H01L 21/68754; H01L 21/68771
(Continued)

(56) References Cited

U.S. PATENT DOCUMENTS 6,339,730 B1 * 1/2002 Matsushima ..... H01L 21/67167
318/568.16
6,492,625 B1 * 12/2002 Boguslavskiy ......... C23C 16/46
118/725
(Continued)

FOREIGN PATENT DOCUMENTS

JP 64-057104 A 3/1989
JP 05-275511 A 10/1993
(Continued)

OTHER PUBLICATIONS

International Search Report, PCT/JP2014/058577, dated Jul. 1, 2014, 2 pgs.
(Continued)

*Primary Examiner* — Kaitlin Joerger
(74) *Attorney, Agent, or Firm* — Volpe and Koenig, P.C.

(57) ABSTRACT

In the present invention, a substrate is placed at a predetermined position on a substrate support even though the substrate is deviated on a substrate transfer unit.
There is provided a substrate processing apparatus that includes a process chamber, a transfer chamber accommodating a substrate transfer unit, a substrate detecting unit, a memory unit configured to store a first reference position information, a second reference position information and a substrate reference position information and a controller configured to generate a detected position information representing a position of a substrate being transferred in the transfer chamber based on a detection result and to control the substrate transfer unit to place the substrate based on the
(Continued)

detected position information, the first reference position information, the substrate reference position information and a difference between the first reference position information and the second reference position information.

15 Claims, 10 Drawing Sheets

(51) Int. Cl.
    H01L 21/687    (2006.01)
    H01L 21/66     (2006.01)
    H01L 21/677    (2006.01)
(52) U.S. Cl.
    CPC ...... *H01L 21/681* (2013.01); *H01L 21/68764* (2013.01); *H01L 21/68771* (2013.01); *H01L 22/20* (2013.01)
(58) Field of Classification Search
    USPC .......................................................... 414/217
    See application file for complete search history.

(56) References Cited

U.S. PATENT DOCUMENTS

| | | | | |
|---|---|---|---|---|
| 7,107,125 | B2* | 9/2006 | Yim | H01L 21/67259 700/245 |
| 7,572,742 | B2* | 8/2009 | Hiroki | H01L 21/67167 414/744.5 |
| 7,942,622 | B2* | 5/2011 | Kondoh | H01L 21/67196 414/217 |
| 8,854,449 | B2* | 10/2014 | Aikawa | C23C 16/44 348/87 |
| 8,883,025 | B2* | 11/2014 | Okita | H01L 21/67109 216/60 |
| 8,945,411 | B2* | 2/2015 | Iwai | H01L 21/6732 216/59 |
| 9,023,429 | B2* | 5/2015 | Takeshima | H01L 21/67109 118/719 |
| 9,139,381 | B2* | 9/2015 | Fujii | H01L 21/67259 |
| 9,227,320 | B2* | 1/2016 | Hiroki | H01L 21/67259 |
| 9,349,589 | B2* | 5/2016 | Enomoto | C23C 16/4584 |
| 9,404,184 | B2* | 8/2016 | Aikawa | C23C 16/44 |
| 2003/0012631 | A1* | 1/2003 | Pencis | B25J 9/0009 414/744.5 |
| 2003/0014155 | A1* | 1/2003 | Pencis | B25J 9/0009 700/213 |
| 2005/0137751 | A1* | 6/2005 | Cox | B25J 9/1692 700/245 |
| 2010/0008688 | A1 | 1/2010 | Kimura | |
| 2010/0080444 | A1* | 4/2010 | Yamaguchi | H01L 21/681 382/144 |
| 2010/0124610 | A1* | 5/2010 | Aikawa | C23C 16/4584 427/255.28 |
| 2010/0227046 | A1* | 9/2010 | Kato | C23C 16/402 427/10 |
| 2011/0135427 | A1* | 6/2011 | Sakaue | H01L 21/67276 414/217 |
| 2012/0075460 | A1 | 3/2012 | Aikawa et al. | |
| 2013/0068726 | A1* | 3/2013 | Okita | H01L 21/67109 216/59 |
| 2013/0167771 | A1* | 7/2013 | Yamaguchi | H01L 21/67259 118/668 |
| 2013/0343841 | A1* | 12/2013 | van der Meulen | H01L 21/677 414/217 |
| 2014/0107825 | A1* | 4/2014 | Kubodera | G05B 19/4189 700/112 |
| 2014/0271055 | A1* | 9/2014 | Weaver | H01L 21/67161 414/221 |
| 2014/0271057 | A1* | 9/2014 | Weaver | H01L 21/67196 414/222.02 |
| 2014/0370628 | A1* | 12/2014 | Sato | H01L 21/67167 438/16 |
| 2015/0303083 | A1* | 10/2015 | Wakabayashi | H01L 21/67126 414/222.02 |
| 2015/0371883 | A1* | 12/2015 | Takahashi | H01L 21/67259 438/5 |
| 2016/0027675 | A1* | 1/2016 | Ravid | H01L 21/67259 118/713 |
| 2016/0153085 | A1* | 6/2016 | Ueda | C23C 16/4405 118/730 |

FOREIGN PATENT DOCUMENTS

| | | |
|---|---|---|
| JP | 2001-068530 A | 3/2001 |
| JP | 2005-038947 A | 2/2005 |
| JP | 2008-173744 A | 7/2008 |
| JP | 2008-218903 A | 9/2008 |
| JP | 2008-306162 A | 12/2008 |
| JP | 2010-062215 A | 3/2010 |
| JP | 2010-093169 A | 4/2010 |
| JP | 2011-222825 A | 11/2011 |
| JP | 2012-94814 A | 5/2012 |
| WO | 2010/013732 A1 | 4/2010 |

OTHER PUBLICATIONS

Office Action for Japanese Patent Appln. No. 2015-508599 dated Jul. 21, 2016 (3 pages).

* cited by examiner

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS-REFERENCE TO RELATED PATENT APPLICATION

This non-provisional U.S. patent application claims priority under 35 U.S.C. §119 of Japanese Patent Application No. 2013-068318 filed on Mar. 28, 2013 and PCT/JP2014/058577 filed on Mar. 26, 2014, the entire contents of which are hereby incorporated by reference.

BACKGROUND OF THE INVENTION

1. Field of the Invention

The present invention relates to a substrate processing apparatus, a method of manufacturing a semiconductor device and a non-transitory computer-readable recording medium.

2. Description of the Related Art

A substrate processing process in which a thin film is formed on a substrate may be performed as a process of manufacturing a semiconductor device such as a flash memory or a dynamic random access memory (DRAM). As a substrate processing apparatus where such a process is performed, a film deposition apparatus having a reaction chamber in which a thin film is simultaneously formed on a plurality of substrates placed on a susceptor has been known.

In the above substrate processing apparatus, a substrate transfer unit is automatically controlled to transfer a substrate is supported on tweezers of the substrate transfer unit and place on a susceptor. In this case, it is required that the substrate on the tweezers is accurately placed at a predetermined position on the susceptor. However, the substrate may be deviated from a predetermined position on the tweezers due to a cause such as the modification of the tweezers occurred while the tweezers are used for a long period of time. Therefore, the substrate is not placed at the predetermined position on the susceptor and thus there is a possibility that a problem in that the in-plane uniformity of the thin film formed on the substrate deteriorates or the substrate is broken may occur. The present invention provides a substrate processing apparatus, in which a substrate can be placed at a predetermined position on a susceptor even though the substrate that is supported on tweezers is deviated, a method of manufacturing a semiconductor device and a non-transitory computer-readable recording medium.

SUMMARY OF THE INVENTION

A representative configuration of a substrate processing apparatus according to the present invention in order to address the above objects is as follows. According to an aspect of the present invention, there is provided a substrate processing apparatus including:

a process chamber accommodating a substrate support and a rotating mechanism configured to rotate the substrate support, the substrate support including a first substrate support unit and a second substrate support unit arranged along a circumference of the substrate support and configured to place a first substrate and a second substrate thereon, respectively, wherein the first substrate and the second substrate are processed while being placed on the first substrate support unit and the second substrate support unit in the process chamber;

a transfer chamber disposed adjacent to the process chamber, the transfer chamber accommodating a substrate transfer unit configured to transfer and place the first substrate and the second substrate on the first substrate support unit and the second substrate support unit, respectively;

a substrate detecting unit configured to detect whether a substrate is present at a predetermined position in the transfer chamber;

a memory unit configured to store a first reference position information, a second reference position information and a substrate reference position information, wherein the first reference position information represents a first reference position corresponding to a reference position of the substrate transfer unit when the first substrate is placed on the first substrate support unit, the second reference position information represents a second reference position corresponding to a reference position of the substrate transfer unit when the second substrate is placed on the second substrate support unit, and the substrate reference position information represents a reference position of the first substrate and the second substrate in the transfer chamber along a transfer path of the first substrate and the second substrate; and a controller configured to generate a detected position information representing a position of a third substrate being transferred in the transfer chamber based on a detection result provided by the substrate detecting unit and to control the substrate transfer unit to place the third substrate on the second substrate support unit based on the detected position information, the first reference position information, the substrate reference position information and a difference between the first reference position information and the second reference position information.

A representative configuration of a method of manufacturing a semiconductor device according to the present invention is as follows. According to another aspect of the present invention, there is provided a method of manufacturing a semiconductor device using a substrate processing apparatus including:

a process chamber accommodating a substrate support and a rotating mechanism configured to rotate the substrate support, the substrate support including a first substrate support unit and a second substrate support unit arranged along a circumference of the substrate support and configured to place a first substrate and a second substrate thereon, respectively; a transfer chamber disposed adjacent to the process chamber, the transfer chamber accommodating a substrate transfer unit configured to transfer and place the first substrate and the second substrate on the first substrate support unit and the second substrate support unit, respectively; and a substrate detecting unit configured to detect whether a substrate is present at a predetermined position in the transfer chamber, the method including:

(a) obtaining a first reference position information and a second reference position information, wherein the first reference position information represents a first reference position corresponding to a reference position of the substrate transfer unit when the first substrate is placed on the first substrate support unit, and the second reference position information represents a second reference position corresponding to a reference position of the substrate transfer unit when the second substrate is placed on the second substrate support unit;

(b) obtaining a substrate reference position information representing a reference position of the first substrate and the second substrate in the transfer chamber along a transfer path of the first substrate and the second substrate;

(c) detecting a position of a third substrate being transferred in the transfer chamber based on a detection result provided by the substrate detecting unit;

(d) placing the third substrate on the first substrate support unit based on a detected position information representing the position of the third substrate detected in the step (c), the first reference position information and the substrate reference position information;

(e) detecting a position of a fourth substrate being transferred in the transfer chamber based on a detection result provided by the substrate detecting unit;

(f) placing the fourth substrate on the second substrate support unit based on a detected position information representing the position of the fourth substrate detected in the step (e), the first reference position information, the substrate reference position information and a difference between the first reference position information and the second reference position information; and (g) forming semiconductor devices on the third substrate and the fourth substrate placed on the first substrate support unit and the second substrate support unit, respectively.

A representative configuration of a non-transitory computer-readable recording medium according to the present invention is as follows. According to still another aspect of the present invention, there is provided a non-transitory computer-readable recording medium storing a program causing a substrate processing apparatus including:

a process chamber accommodating a substrate support and a rotating mechanism configured to rotate the substrate support, the substrate support including a first substrate support unit and a second substrate support unit arranged along a circumference of the substrate support and configured to place a first substrate and a second substrate thereon, respectively; a transfer chamber disposed adjacent to the process chamber, the transfer chamber accommodating a substrate transfer unit configured to transfer and place the first substrate and the second substrate on the first substrate support unit and the second substrate support unit, respectively; and a substrate detecting unit configured to detect whether a substrate is present at a predetermined position in the transfer chamber, to perform:

(a) obtaining a first reference position information and a second reference position information, wherein the first reference position information represents a first reference position corresponding to a reference position of the substrate transfer unit when the first substrate is placed on the first substrate support unit, and the second reference position information represents a second reference position corresponding to a reference position of the substrate transfer unit when the second substrate is placed on the second substrate support unit;

(b) obtaining a substrate reference position information representing a reference position of the first substrate and the second substrate in the transfer chamber along a transfer path of the first substrate and the second substrate;

(c) detecting a position of a third substrate being transferred in the transfer chamber based on a detection result provided by the substrate detecting unit;

(d) placing the third substrate on the first substrate support unit based on a detected position information representing the position of the third substrate detected in the sequence (c), the first reference position information and the substrate reference position information;

(e) detecting a position of a fourth substrate being transferred in the transfer chamber based on a detection result provided by the substrate detecting unit;

(f) placing the fourth substrate on the second substrate support unit based on a detected position information representing the position of the fourth substrate detected in the sequence (e), the first reference position information, the substrate reference position information and a difference between the first reference position information and the second reference position information; and (g) forming semiconductor devices on the third substrate and the fourth substrate placed on the first substrate support unit and the second substrate support unit, respectively.

DETAILED DESCRIPTION OF THE PREFERRED EMBODIMENTS

First Embodiment (1) Configuration of Substrate Processing Apparatus

Figure 1:
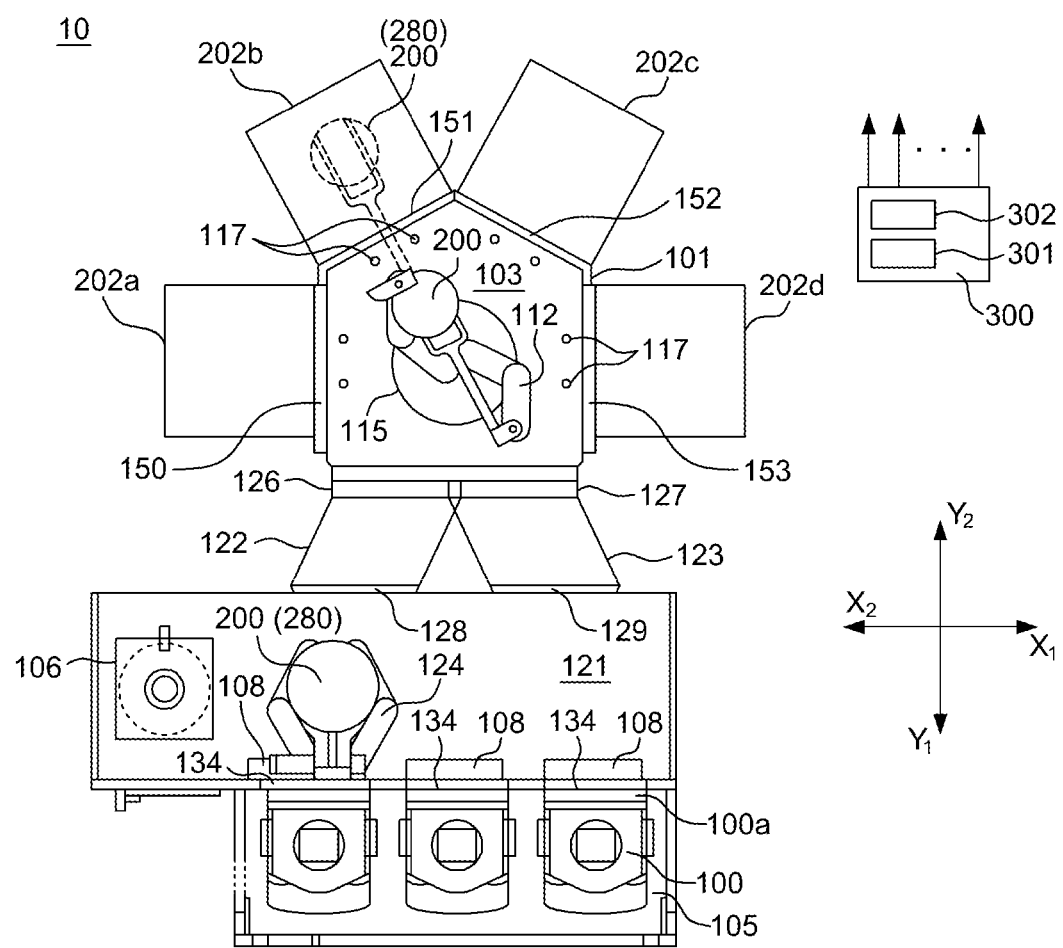
FIG. 1 is a top schematic view of a substrate processing apparatus according to a first embodiment of the present invention.
Figure 2:
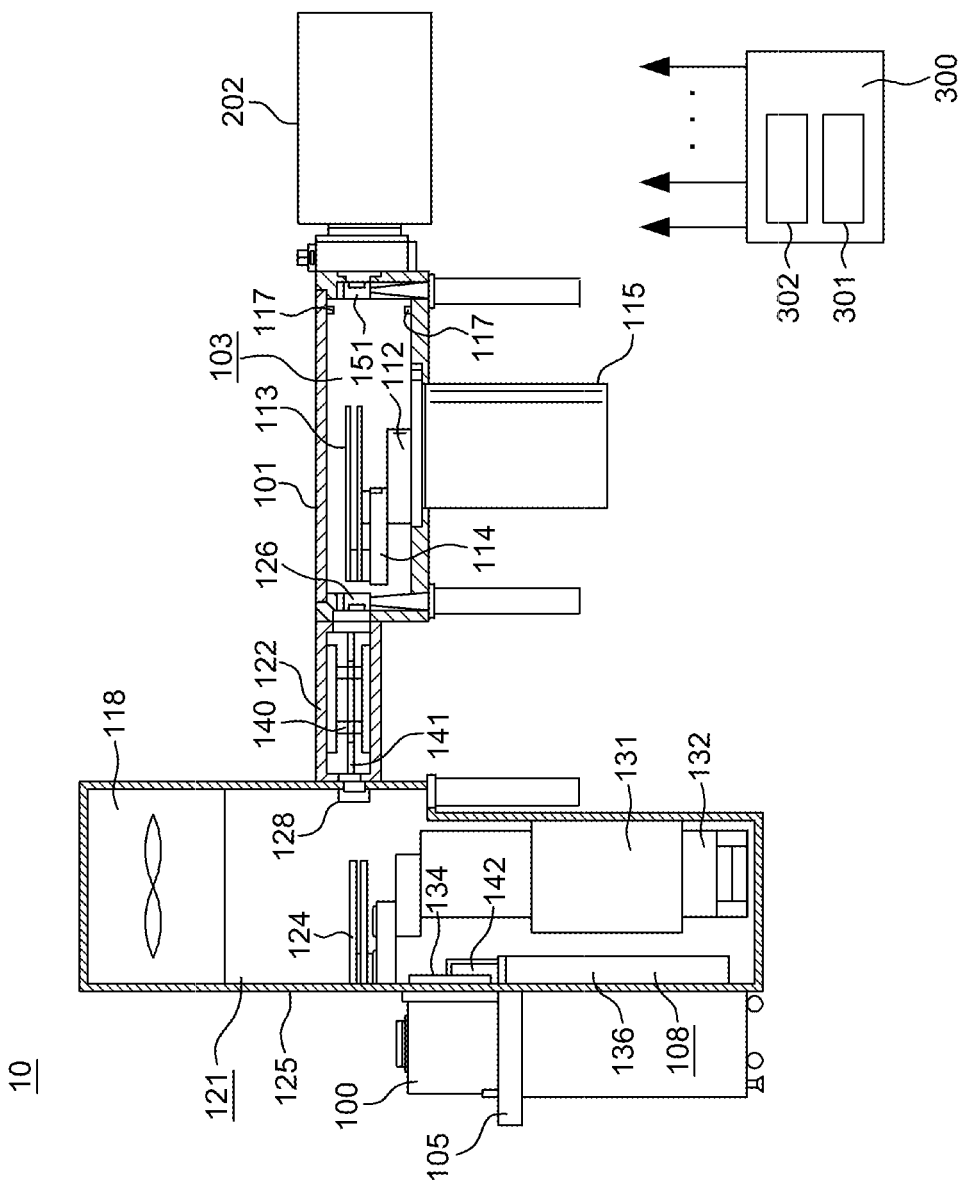
FIG. 2 is a vertical cross-sectional schematic view of the substrate processing apparatus according to the first embodiment of the present invention.

First, a configuration of a substrate processing apparatus 10 according to the first embodiment will be described with reference to FIGS. 1 and 2. FIG. 1 is a configuration diagram (top view) schematically illustrating the multi-wafer substrate processing apparatus 10 according to the first embodiment. FIG. 2 is a vertical cross-sectional schematic view of the substrate processing apparatus 10 according to the first embodiment.

An overview of the substrate processing apparatus 10 (hereinafter simply referred to as an "apparatus") according to the first embodiment will be described with reference to FIGS. 1 and 2. Also, in the substrate processing apparatus 10 to which the present invention is applied, as a carrier for transferring a substrate such as a processing substrate 200 or a dummy substrate 280 serving as a product, a front opening unified pod (FOUP) (hereinafter referred to as a "pod") is used. Also, in the following description, front, rear, left and right are based on FIG. 1. That is, a direction of $X_1$ is defined as the right, a direction of $X_2$ as the left, a direction of $Y_1$ as the front and a direction of $Y_2$ as the rear in FIG. 1. Also, the apparatus is an apparatus that transfers and processes the processing substrate 200 and transfers the dummy substrate 280. However, the processing substrate 200 will be mainly described in the following description.

As illustrated in FIGS. 1 and 2, the substrate processing apparatus 10 includes a first transfer chamber 103 having a load lock chamber structure that can withstand a pressure (negative pressure) below atmospheric pressure such as a vacuum state. A housing 101 of the first transfer chamber 103 has, for example, a pentagonal shape in a plan view and is formed to have a box shape whose upper and lower ends are closed. A first substrate transfer device 112 that is a substrate transfer unit capable of simultaneously transferring the two substrates 200 under a negative pressure is provided in the first transfer chamber 103. Here, the first substrate transfer device 112 may transfer the one substrate 200. The first substrate transfer device 112 is configured to perform lifting by a first substrate transfer device elevator 115 while airtightness of the first transfer chamber 103 is maintained.

Among five sidewalls of the housing 101, at two sidewalls located in a front side, spare chambers 122 and 123 configured to have functions of both loading and unloading are connected via gate valves 126 and 127, respectively and are configured to have a structure that can withstand a negative pressure. Also, the two substrates 200 may be placed to be stacked in the spare chambers 122 and 123 (load lock chambers) by a substrate support 140.

A partitioning plate (intermediate plate) 141 disposed between the substrates is provided in the spare chambers 122 and 123. When a plurality of processed substrates move into the spare chamber 122 or 123, thermal interference, in which the decreasing of a temperature of the first moved processed substrate in a cooling state is delayed due to a thermal effect by the following moved processed substrate, may be prevented by the partitioning plate 141.

Here, a general method of improving cooling efficiency will be described. When coolant or chiller flows to the partitioning plate 141 of the spare chambers 122 and 123 and a wall temperature is lowered, cooling efficiency of the processed substrate entered any slot may be increased. At a negative pressure, when a distance between the substrate and the partitioning plate 141 is too far away, cooling efficiency is reduced due to heat exchange. Thus, as a method of improving the cooling efficiency, the substrate support (pin) 140 is placed, the substrate support 140 is raised and lowered and a driving device may be provided to close to walls of the spare chambers 122 and 123.

A second transfer chamber 121 used under atmospheric pressure is connected to front sides of the spare chamber 122 and the spare chamber 123 via gate valves 128 and 129. A second substrate transfer device 124 that transfers the substrate 200 is provided in the second transfer chamber 121. The second substrate transfer device 124 is configured to be lifted by a second substrate transfer device elevator 131 provided in the second transfer chamber 121 and is configured to laterally reciprocate by a linear actuator 132.

As illustrated in FIG. 1, a notch or orientation flat aligning device 106 may be provided at a left side of the second transfer chamber 121. Also, as illustrated in FIG. 2, a clean unit 118 that supplies clean air is provided above the second transfer chamber 121.

As illustrated in FIGS. 1 and 2, at a front side of a housing 125 of the second transfer chamber 121, a substrate loading and unloading port 134 that loads or unloads the substrate 200 into or from the second transfer chamber 121 and a pod opener 108 are provided. At a side opposite to the pod opener 108, that is, at an outer side of the housing 125, a load port (IO stage) 105 is provided via the substrate loading and unloading port 134. The pod opener 108 opens or closes a cap 100a of a pod 100 and includes a closure 142 capable of closing the substrate loading and unloading port 134 and a driving mechanism 136 that drives the closure 142. When the cap 100a of the pod 100 placed on the load port 105 is opened or closed, the substrate 200 may be loaded or unloaded into or from the pod 100. Also, the pod 100 is supplied or discharged to or from the load port 105 by an in-process transfer device (such as OHT) (not illustrated).

As illustrated in FIG. 1, among five sidewalls of the housing 101 of the first transfer chamber 103, a first process chamber 202a, a second process chamber 202b, a third process chamber 202c and a fourth process chamber 202d, that perform desired processes on the substrate, are adjacently connected to four sidewalls located at a rear side (back side), respectively, via gate valves 150, 151, 152 and 153. That is, the first transfer chamber 103 is provided adjacent to the process chambers 202a through 202d.

Sensors 117 that detect whether the substrate 200 is passed or not are provided at a bottom of a ceiling portion of the housing 101 of the first transfer chamber 103 and to the vicinity of the gate valves 150, 151, 152 and 153. The sensors 117 are connected to a control unit 300 to be described below with signals. The sensor 117 is a substrate detecting unit that detects whether a substrate is present or not and constitutes a substrate position detecting unit that detects a position of the substrate 200 being transferred in the first transfer chamber 103 with the control unit 300. The sensors 117 include, for example, two light transmission sensors 117a and 117b (see FIG. 3). The transmission sensors 117a and 117b each include, for example, a light emitting portion and a light receiving portion in a vertical direction (see FIG. 2). When an end of the substrate 200 moves between the light emitting portion and light receiving portion of the transmission sensor 117, light emitted from the light emitting portion is reflected by the substrate 200 and thus the light receiving portion may not receive the light emitted from the light emitting portion. In this manner, it is possible to detect the presence of the end of the substrate 200. Also, one sensor 117a or 117b refers to a unit serving as a sensor and has a configuration including, for example, the light emitting portion and light receiving portion as described above.

Figure 6:
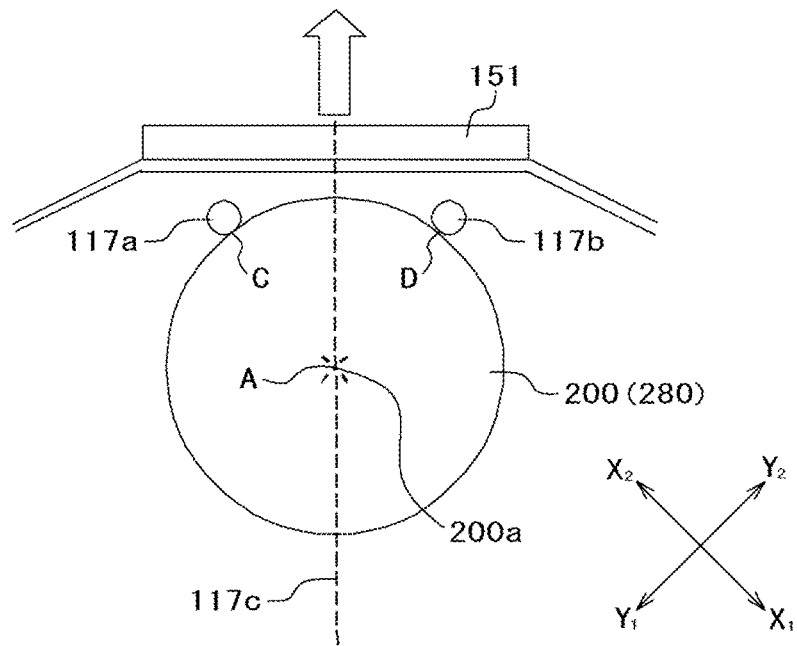
FIG. 6 is an explanatory diagram of a sensor according to the first embodiment of the present invention.

The two transmission sensors 117 is disposed, for example, to have the following position relationship as illustrated in FIG. 6. FIG. 6 is an explanatory diagram of a sensor according to the first embodiment. An interval between the transmission sensors 117a and 117b is smaller than a diameter of the substrate 200. A line that connects the transmission sensors 117a and 117b is disposed parallel to the gate valves 150, 151, 152 and 153. The transmission sensors 117a and 117b in a horizontal plane (XY plane) are located in the first transfer chamber 103 and in the vicinity of the process chamber 202. For example, as illustrated in FIG. 2, the transmission sensors 117a and 117b are disposed at positions closer to the gate valve 151 that is a boundary of the process chamber 202 than a central axis of the first substrate transfer device elevator 115 or a center of the first transfer chamber 103. Also, as illustrated in FIG. 6, the two transmission sensors 117a and 117b are preferably disposed at both sides of a moving path 117c using the moving path 117c as a linearly symmetrical axis via the moving path 117c of the substrate 200. The moving path 117c will be described below.

(2) Configuration of Process Chamber

Figure 3:
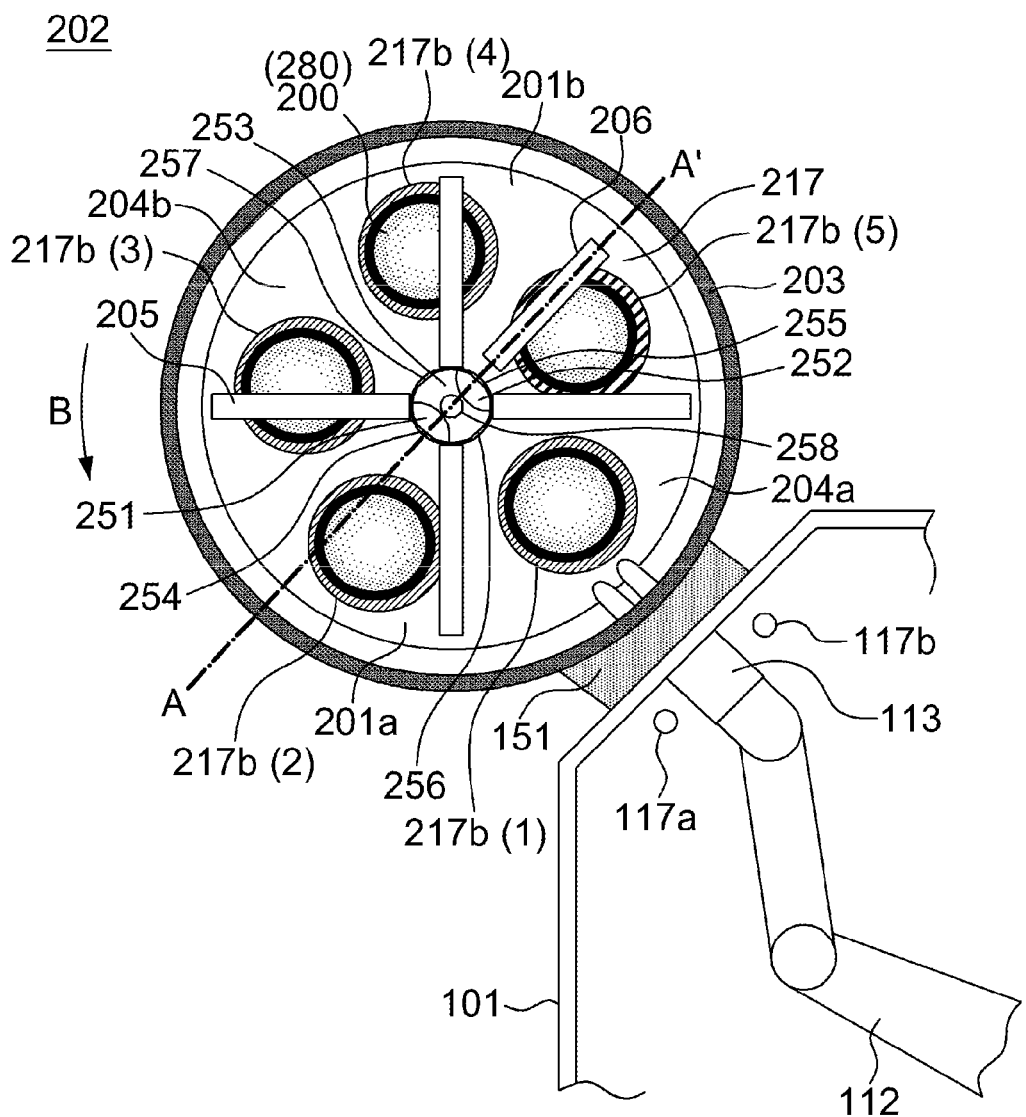
FIG. 3 is a cross-sectional schematic view of a substrate process chamber according to the first embodiment of the present invention.
Figure 4:
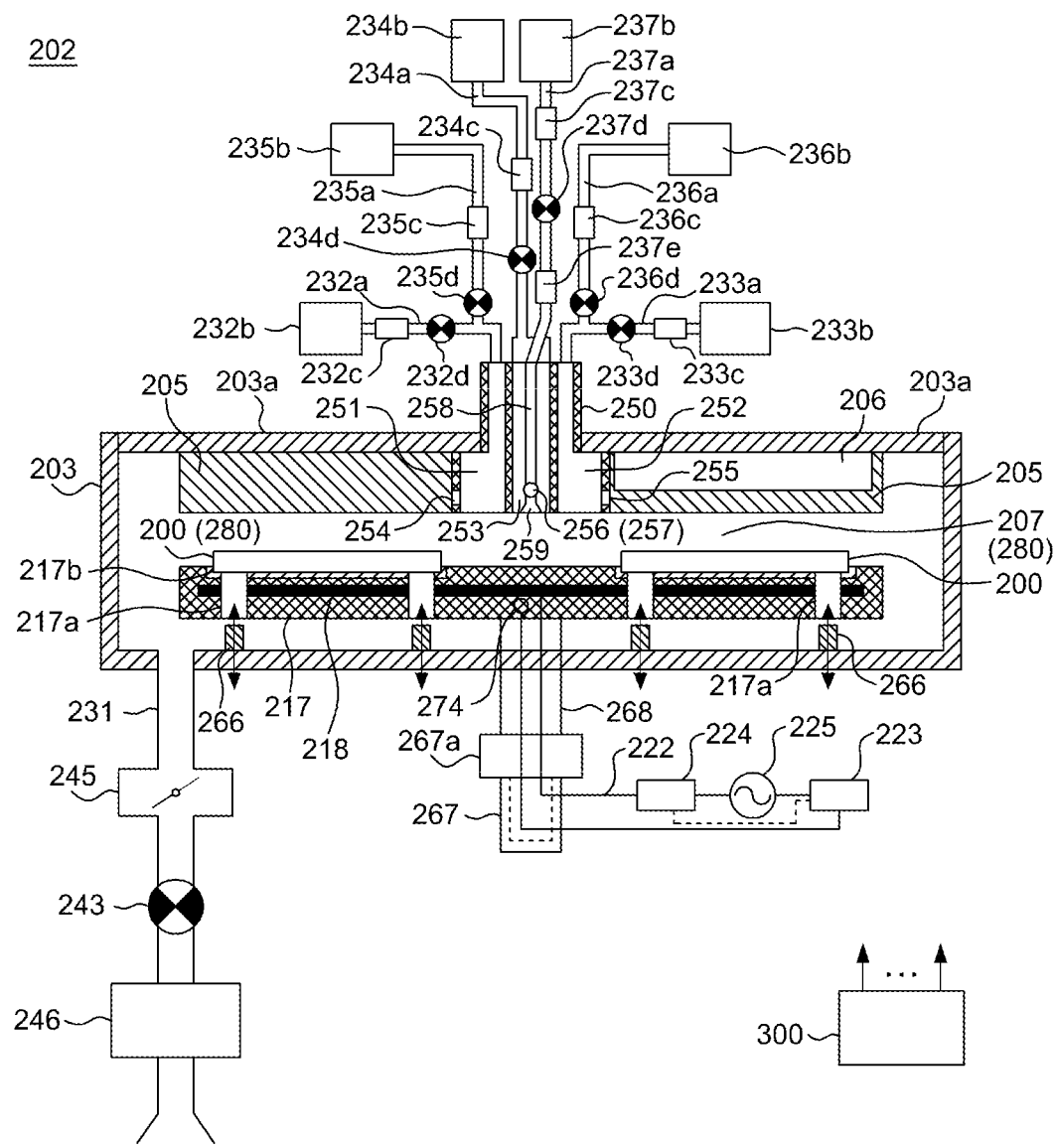
FIG. 4 is a vertical cross-sectional schematic view of the substrate process chamber according to the first embodiment of the present invention.

Next, a configuration of the process chamber 202 serving as a substrate process chamber according to the present embodiment will be generally described with reference to FIGS. 3 and 4. FIG. 3 is a cross-sectional schematic view of the process chamber according to the present embodiment. FIG. 4 is a vertical cross-sectional schematic view of the process chamber according to the present embodiment and is a cross-sectional view of the process chamber taken along line A-A' illustrated in FIG. 3.

[Reaction Container]

As illustrated in FIGS. 3 and 4, the process chamber 202 includes a reaction container 203 that is a cylindrical airtight container. A process space 207 of the substrate 200 is formed in the reaction container 203. Four partition plates 205 that radially extend from a center portion are provided at an upper side of the process space 207 in the reaction container 203. The four partition plates 205 are configured to divide the process space 207 into a first processing region 201a, a first purge region 204a, a second processing region 201b and a second purge region 204b. Also, the first processing region 201a, the first purge region 204a, the second processing region 201b and the second purge region 204b are configured to be sequentially arranged along a rotation direction (direction of an arrow B of FIG. 3) of a susceptor (substrate support) 217 to be described below.

As will be described below, the substrate 200 placed on the susceptor 217 sequentially moves to the first processing region 201a, the first purge region 204a, the second processing region 201b and the second purge region 204b by rotating the susceptor 217. Also, as will be described below, a first processing gas serving as a first gas is supplied into the first processing region 201a, a second processing gas serving as a second gas is supplied into the second processing region 201b and an inert gas is supplied into the first purge region 204a and the second purge region 204b. Accordingly, the first processing gas, the inert gas, the second processing gas and the inert gas are sequentially supplied onto the substrate 200 by rotating the susceptor 217. A configuration of the susceptor 217 and a gas supply system will be described below.

A gap having a predetermined width is provided between an end of the partition plate 205 and a sidewall of the reaction container 203 so that a gas passes through. By ejecting the inert gas from inside of the first purge region 204a and the second purge region 204b into the first processing region 201a and the second processing region 201b via the gap, it is possible to suppress a processing gas from being introduced into the first purge region 204a and the second purge region 204b and it is possible to prevent a reaction of the processing gas.

Also, in the present embodiment, angles between the partition plates 205 are each determined to 90°. However, the present invention is not limited thereto. That is, in consideration of the supply time of various gases to the substrate 200, for example, the angle of the two partition plates 205 that form the second processing region 201b may be appropriately changed to be increased.

Also, each processing region is divided by the partition plate 205, but is not limited thereto. The gases supplied to the processing regions 201a and 201b may not be mixed.

[Susceptor]

As illustrated in FIGS. 3 and 4, at a lower side of the partition plate 205, that is, at a bottom center in the reaction container 203, the susceptor 217 serving as a substrate support, that has an axis of rotation at a center of the reaction container 203 and is rotatable, is provided. The susceptor 217 is made of, for example, a non-metallic material such as aluminum nitride (AlN), a ceramic, quartz or the like in order to decrease metal contamination of the substrate 200. Also, the susceptor 217 is electrically insulated from the reaction container 203.

The susceptor 217 is configured to arrange and support the plurality (five) of substrates 200 on the same plane and along the same circumference in the reaction container 203. Here, the term "the same plane" is not limited to exactly the same plane, but merely indicates that the plurality of substrates 200 may be arranged not to be stacked as illustrated in FIGS. 3 and 4 when the susceptor 217 is seen from the top.

Also, substrate support units 217b (217b(1) to 217b(n)) are provided at a support position of the substrate 200 on a surface of the susceptor 217. The substrate support units 217b are provided along the same circumference corresponding to the number n of the substrates 200 to be processed. n is a natural number of 2 or more. In the present embodiment, since it is assumed to process five substrates, the five substrate support units 217b are provided. The substrate support unit 217b may have, for example, a circular shape when seen from the top and a concave shape when seen from the side. In this case, preferably, the substrate support unit 217b has a diameter that is slightly increased than a diameter of the substrate 200. When the substrate 200 is placed on the substrate support unit 217b, a position of the substrate 200 may be easily determined. Also, it is possible to suppress a position deviation of the substrate 200 such as the substrate 200 protruding from the susceptor 217 due to centrifugal force resulting from rotation of the susceptor 217.

As illustrated in FIG. 4, a lifting mechanism 268 that lifts the susceptor 217 is provided in the susceptor 217. A plurality of through holes 217a are provided in the susceptor 217. At a bottom surface of the above-described reaction container 203, a plurality of substrate lift pins 266 that lift the substrate 200 and support a rear surface of the substrate 200 when the substrate 200 is loaded or unloaded into or from the reaction container 203 are provided. The through hole 217a and a substrate lift pin 266 are disposed so that the substrate lift pin 266 passes through the through hole 217a in non-contact with the susceptor 217 when the substrate lift pin 266 is raised or when the susceptor 217 is lowered by the lifting mechanism 268.

In the lifting mechanism 268, a rotating mechanism 267 that horizontally rotates the susceptor 217 is provided. The rotating mechanism 267 has a non-illustrated axis of rotation that is connected to the susceptor 217 and is configured to rotate the susceptor 217 by operating the rotating mechanism 267. The control unit 300 to be described below is connected to the rotating mechanism 267 via a coupling portion 267a. The coupling portion 267a is configured as a slip ring mechanism that electrically connects between a rotation side and a fixed side by a metal brush and the like. Accordingly, rotation of the susceptor 217 is not interfered. The control unit 300 is configured to control power supply to the rotating mechanism 267 so as to rotate the susceptor 217 at a predetermined speed for a predetermined time. As described above, the substrate 200 placed on the susceptor 217 sequentially moves to the first processing region 201a, the first purge region 204a, the second processing region 201b and the second purge region 204b by rotating the susceptor 217.

[Heating Unit]

A heater 218 serving as a heating unit is integrally embedded in the susceptor 217 in order to heat the substrate 200. When power is supplied to the heater 218, a surface of the substrate 200 is heated to a predetermined temperature (for example, room temperature to 1,000° C.). Also, the plurality (five) of heaters 218 may be provided on the same plane so as to individually heat each of the substrates 200 that are placed on the susceptor 217.

A temperature sensor 274 is provided in the susceptor 217. A temperature regulator 223, a power regulator 224 and a heater power source 225 are electrically connected to the heater 218 and the temperature sensor 274 via a power supply line 222. Power supply to the heater 218 is controlled based on temperature information detected by the temperature sensor 274.

[Gas Supply Unit]

A gas supply unit 250 including a first processing gas inlet 251, a second processing gas inlet 252, an inert gas inlet 253 and a cleaning gas inlet 258 is provided at an upper side of the reaction container 203. The gas supply unit 250 is hermetically provided in an opening that opens at the upper side of the reaction container 203. A first gas outlet 254 is provided at a sidewall of the first processing gas inlet 251. A second gas outlet 255 is provided at a sidewall of the second processing gas inlet 252. A first inert gas outlet 256 and a second inert gas outlet 257 are provided at sidewalls of the inert gas inlet 253 so as to face each other. A cleaning gas supply hole 259 that is an end of the cleaning gas inlet 258 is provided at a bottom of the gas supply unit 250. That is, the cleaning gas supply hole 259 is provided at a lower position than the first gas outlet 254, the second gas outlet 255 and the inert gas outlets 256 and 257.

The gas supply unit 250 supplies the first processing gas from the first processing gas inlet 251 into the first processing region 201a, the second processing gas from the second processing gas inlet 252 into the second processing region 201b and the inert gas from the inert gas inlet 253 into the first purge region 204a and the second purge region 204b. The gas supply unit 250 may individually supply each of the processing gas and the inert gas into each of the regions without mixing and may also concurrently supply each of the processing gas and the inert gas into each of the regions.

[Processing Gas Supply System]

A first gas supply pipe 232a is connected to an upstream side of the first processing gas inlet 251. In an upstream side of the first gas supply pipe 232a, in order from an upstream end, a source gas supply source 232b, a mass flow controller (MFC) 232c serving as a flow rate controller (flow rate control unit) and a valve 232d serving as an on-off valve are provided.

Through the first gas supply pipe 232a, as the first gas (first processing gas), for example, a silicon-containing gas is supplied into the first processing region 201a via the MFC 232c, the valve 232d, the first processing gas inlet 251 and the first gas outlet 254. Trisilylamine ((SiH$_3$)$_3$N, abbreviated to: TSA) gas may be used as the silicon-containing gas, for example, serving as a precursor. Also, the first processing gas may be any one of in a solid, liquid and gas states under room temperature and room pressure. Here, this will be described as in a gas state. When the first processing gas is in a liquid state under room temperature and room pressure, a vaporizer (not illustrated) may be provided between the source gas supply source 232b and the MFC 232c.

Also, as the silicon-containing gas, for example, hexamethyldisilazane (C$_6$H$_{19}$NSi$_2$, abbreviated to: HMDS) that is an organic silicon material in addition to the TSA may be used. The first gas uses a material having a higher degree of tackiness (viscosity) than the second gas to be described below.

A second gas supply pipe 233a is connected to an upstream side of the second processing gas inlet 252. In an upstream side of the second gas supply pipe 233a, in order from an upstream end, a source gas supply source 233b, an MFC 233c serving as a flow rate controller (flow rate control unit) and a valve 233d serving as an on-off valve are provided.

Through the second gas supply pipe 233a, as the second gas (second processing gas or reactive gas), for example, oxygen (O$_2$) gas that is an oxygen-containing gas is supplied into the second processing region 201b via the MFC 233c, the valve 233d, the second processing gas inlet 252 and the second gas outlet 255. The oxygen gas that is the second processing gas becomes a plasma state by a plasma generating unit 206 to be exposed onto the substrate 200. Also, the oxygen gas that is the second processing gas may regulate a temperature of the heater 218 and a pressure in the reaction container 203 within a predetermined range to activate to heat. Also, ozone (O$_3$) gas or water vapor (H$_2$O) may be used as the oxygen-containing gas. The second gas uses a material having a lower degree of tackiness (viscosity) than the first gas.

A first processing gas supply system 232 (may also be called a silicon-containing gas supply system) mainly includes the first gas supply pipe 232a, the MFC 232c and the valve 232d. Also, the source gas supply source 232b, the first processing gas inlet 251 and the first gas outlet 254 may be included in the first processing gas supply system. Also, a second processing gas supply system 233 (may also be called an oxygen-containing gas supply system) mainly includes the second gas supply pipe 233a, the MFC 233c and the valve 233d. Also, the source gas supply source 233b, the second processing gas inlet 252 and the second gas outlet 255 may be included in the second processing gas supply system. The processing gas supply system mainly includes the first processing gas supply system and the second processing gas supply system.

[Inert Gas Supply System]

A first inert gas supply pipe 234a is connected to an upstream side of the inert gas inlet 253. In an upstream side of the first inert gas supply pipe 234a, in order from an upstream end, an inert gas supply source 234b, an MFC 234c serving as a flow rate controller (flow rate control unit) and a valve 234d serving as an on-off valve are provided.

Through the first inert gas supply pipe 234a, for example, the inert gas including nitrogen (N$_2$) gas is supplied into the first purge region 204a and the second purge region 204b via the MFC 234c, the valve 234d, the inert gas inlet 253, the first inert gas outlet 256 and the second inert gas outlet 257. The inert gas supplied into the first purge region 204a and the second purge region 204b serves as a purge gas in a film forming process (S106) to be described below. Rare gases such as helium (He) gas, neon (Ne) gas and argon (Ar) gas in addition to the nitrogen (N$_2$) gas may be used as the inert gas.

A downstream end of a second inert gas supply pipe 235a is connected downstream from the valve 232d of the first gas supply pipe 232a. In order from an upstream end, an inert gas supply source 235b, an MFC 235c serving as a flow rate controller (flow rate control unit) and a valve 235d serving as an on-off valve are provided.

Through the second inert gas supply pipe 235a, as the inert gas, for example, nitrogen (N₂) gas is supplied into the first processing region 201a via the MFC 235c, the valve 235d, the first gas supply pipe 232a, the first processing gas inlet 251 and the first gas outlet 254. The inert gas supplied into the first processing region 201a serves as a carrier gas or a dilution gas in the film forming process (S106).

Also, a downstream end of a third inert gas supply pipe 236a is connected to a downstream side from the valve 233d of the second gas supply pipe 233a. In order from an upstream end, an inert gas supply source 236b, an MFC 236c serving as a flow rate controller (flow rate control unit) and a valve 236d serving as an on-off valve are provided.

Through the third inert gas supply pipe 236a, as the inert gas, for example, nitrogen (N₂) gas is supplied into the second processing region 201b via the MFC 236c, the valve 236d, the second gas supply pipe 233a, the second processing gas inlet 252 and the second gas outlet 255. The inert gas supplied into the second processing region 201b serves as a carrier gas or a dilution gas in the film forming process (S106), similar to the inert gas supplied into the first processing region 201a.

A first inert gas supply system 234 mainly includes the first inert gas supply pipe 234a, the MFC 234c and the valve 234d. Also, the inert gas supply source 234b, the inert gas inlet 253, the first inert gas outlet 256 and the second inert gas outlet 257 may be included in the first inert gas supply system.

Also, a second inert gas supply system 235 mainly includes the second inert gas supply pipe 235a, the MFC 235c and the valve 235d. Also, the inert gas supply source 235b, the first gas supply pipe 232a, the first processing gas inlet 251 and the first gas outlet 254 may be included in the second inert gas supply system.

Also, a third inert gas supply system 236 mainly includes the third inert gas supply pipe 236a, the MFC 236c and the valve 236d. Also, the inert gas supply source 236b, the second gas supply pipe 233a, the second processing gas inlet 252 and the second gas outlet 255 may be included in the third inert gas supply system. The inert gas supply system mainly includes the first to third inert gas supply systems.

[Cleaning Gas Supply System]

A cleaning gas supply pipe 237a is connected to an upstream side of the cleaning gas inlet 258. In an upstream side of the cleaning gas supply pipe 237a, in order from an upstream end, a cleaning gas supply source 237b, an MFC 237c serving as a flow rate controller (flow rate control unit), a valve 237d serving as an on-off valve and a remote plasma generating unit 237e serving as a plasma generating unit are provided.

Through the first gas supply pipe 232a, as a cleaning gas, for example, nitrogen trifluoride (NF₃) gas is supplied. The cleaning gas is supplied to the reaction container 203 via the MFC 237c, the valve 237d, the remote plasma generating unit 237e, the cleaning gas inlet 258 and the cleaning gas supply hole 259. The cleaning gas becomes a plasma state by the remote plasma generating unit 237e.

The cleaning gas inlet 258 is disposed at a center portion of the inert gas inlet 253 and between the first processing gas inlet 251 and the second processing gas inlet 252 as illustrated in FIG. 3.

[Cover]

A cover (not illustrated) that is a plasma-resistant material is provided at a center portion of the susceptor 217 and at a position opposite to the cleaning gas supply hole 259.

When the substrate 200 is processed using the present apparatus, an adherend generated by liquefying, solidifying the gas or byproduct generated by reaction of the gas or the like is attached to a portion with which a gas is in contact in the susceptor 217 or in a wall of the process chamber.

In the apparatus of the present embodiment, the first processing gas is supplied from the first gas outlet 254 onto the substrate 200. Therefore, a material that is an object of cleaning is attached to the wall of the process chamber or the susceptor 217 in the first processing region 201a.

Also, the second processing gas is ejected from the second gas outlet 255, becomes a plasma state by the plasma generating unit 206 and then is supplied onto the substrate 200. In this case, for example, by the second gas reacted with the first gas attached onto the susceptor 217, a film is formed at a place other than the substrate 200 and a byproduct is also generated.

In order to remove the cleaning objects, the substrate processing process is performed a predetermined number of times and then a cleaning process is performed. The cleaning process is performed by a cleaning gas supplied through the cleaning gas supply hole 259. The cleaning gas becomes a plasma state by the remote plasma generating unit 237e.

The cleaning gas regulates a flow rate or energy to fit a portion having the largest amount of attachment, for example, the first processing region 201a. Therefore, when the cleaning gas is in contact with a portion to which the cleaning object is not adhered, the portion is etched by the cleaning gas and may be a cause of particles.

Since the first gas or the second gas is not supplied to a position opposite to the cleaning gas supply hole 259 as illustrated in FIG. 4, the cleaning object is hardly adhered. Therefore, the cover that is a plasma-resistant material is provided at the position opposite to the cleaning gas supply hole 259. By the configuration, it is possible to prevent from excessive etching at the position opposite to the cleaning gas supply hole 259.

The cover is fixed to a counterbore provided at a center of the susceptor 217 by interlocking. When the cover is fixed to the counterbore, deviation by the rotation of the susceptor 217 is prevented and the cover is easily exchanged.

Preferably, the cover has a circular shape when seen from the cleaning gas supply hole 259. An end thereof, which is as a portion with which the first and second gases are not in contact, is set closer to in a central direction of a diameter of the susceptor 217 than the first gas outlet 254 and the second gas outlet 255. By the configuration, the portion to which the cleaning object is not adhered may have a plasma-resistant material.

[Exhaust System]

As illustrated in FIG. 4, an exhaust pipe 231 that exhausts atmospheres in the processing regions 201a and 201b and the purge regions 204a and 204b is provided in the reaction container 203. A vacuum pump 246 serving as a vacuum-exhaust device is connected to the exhaust pipe 231 via a flow rate control valve 245 serving as a flow rate controller (flow rate control unit) that controls a gas flow rate and an auto pressure controller (APC) valve 243 serving as a pressure regulator (pressure regulating unit) and is configured to vacuum-exhaust so that a pressure in the reaction container 203 becomes a predetermined pressure (a degree of vacuum). Also, the APC valve 243 is an on-off valve that may open or close a valve to perform vacuum exhaust or vacuum exhaust stop in the reaction container 203 and adjust a degree of valve opening to regulate a pressure in the reaction container 203. An exhaust system mainly includes the exhaust pipe 231, the APC valve 243 and the flow rate control valve 245. Also, the exhaust system may include the vacuum pump 246.

[Control Unit]

Figure 5:
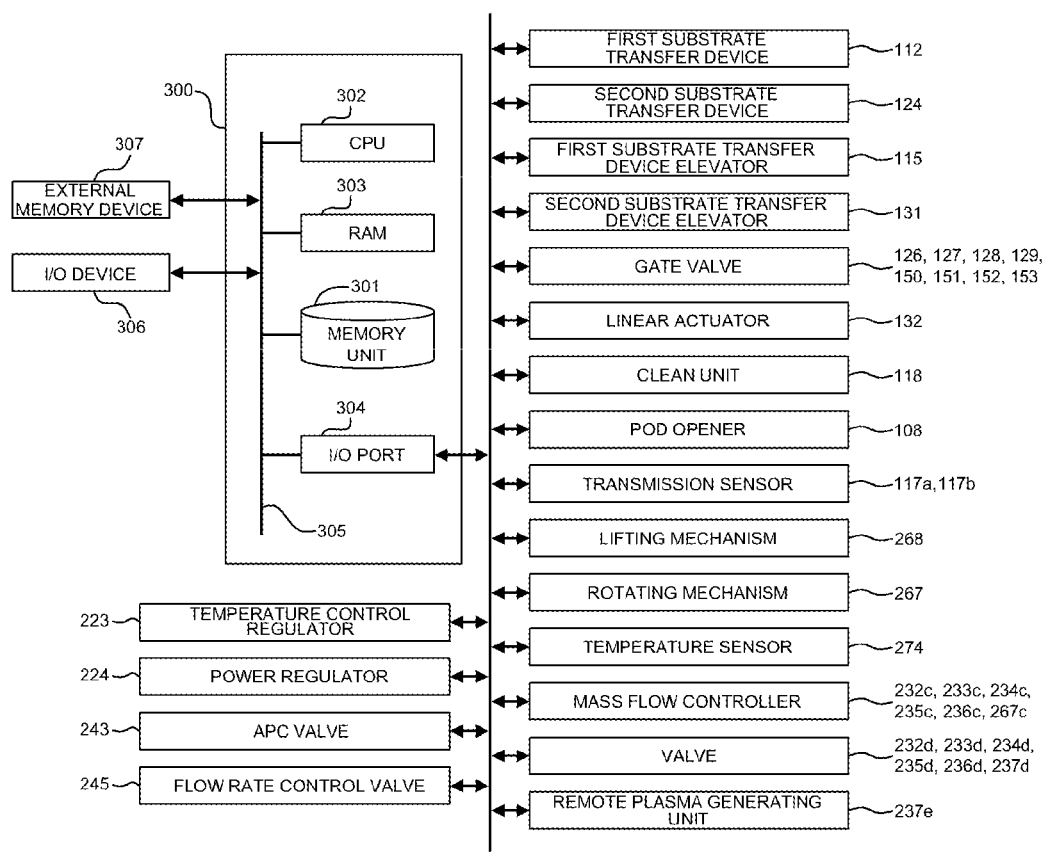
FIG. 5 is a configuration diagram schematically illustrating a controller according to the first embodiment of the present invention.

As illustrated in FIG. 5, the control unit (controller, control device) 300 is configured as a computer that includes a central processing unit (CPU) 302, a random access memory (RAM) 303, a memory unit 301 and an I/O port 304. The RAM 303, the memory unit 301 and the I/O port 304 are configured to exchange data with the CPU 302 via an internal bus 305. An I/O device 306 configured as, for example, a touch panel, is connected to the controller 300.

The memory unit 301 is configured as, for example, a flash memory, a hard disk drive (HDD) or the like. A control program controlling operations of the substrate processing apparatus or a process recipe describing sequences or conditions of substrate processing to be described below are readably stored in the memory unit 301. Also, the process recipe, which is a combination of sequences, causes the controller 300 to execute each sequence in a substrate processing process to be described below in order to obtain a predetermined result and functions as a program. Hereinafter, such a process recipe, a control program and the like are collectively simply called a "program." Also, when the term "program" is used in this specification, it may refer to either the process recipe or the control program or both thereof. Also, the RAM 303 is configured as a memory area (work area) in which a program, data and the like read by the CPU 302 are temporarily stored.

The I/O port 304 is connected to the first substrate transfer device 112, the second substrate transfer device 124, the first substrate transfer device elevator 115, the second substrate transfer device elevator 131, the gate valves 126, 127, 128, 129, 150, 151, 152 and 153, the linear actuator 132, the clean unit 118, the pod opener 108, the sensor 117 (transmission sensor 117a and transmission sensor 117b), the lifting mechanism 268, the rotating mechanism 267, the temperature sensor 274, the temperature regulator 223, the power regulator 224, the heater power source 225, the MFCs 232c, 233c, 234c, 235c, 236c and 237c, the valves 232d, 233d, 234d, 235d, 236d and 237d, the remote plasma generating unit 237e, the APC valve 243, the flow rate control valve 245 and the like, which are illustrated above.

The CPU 302 reads and executes the control program from the memory unit 301 and reads the process recipe from the memory unit 301 according to an input of a manipulating command from the I/O device 306. Also, to comply with the contents of the read process recipe, the CPU 302 is configured to control a flow rate regulating operation of various gases by the MFCs 232c, 233c, 234c, 235c, 236c and 237c, an opening or closing operation of the valves 232d, 233d, 234d, 235d, 236d and 237d, an opening or closing regulating operation by the APC valve 243, an operation by the temperature regulator 223 based on the temperature sensor 274, a substrate transferring operation by the first substrate transfer device 112, the second substrate transfer device 124, the first substrate transfer device elevator 115, the second substrate transfer device elevator 131, the gate valves 126, 127, 128, 129, 150, 151, 152 and 153, the substrate support 140, the linear actuator 132 and the sensor 117 (transmission sensor 117a and transmission sensor 117b) and the like.

Also, the controller 300 is not limited to being configured as a dedicated computer, but may be configured as a general-purpose computer. For example, the controller 300 according to the present embodiment may be configured by preparing an external memory device 307 (for example, a magnetic tape, a magnetic disk such as a flexible disk and a hard disk, an optical disc such as a CD or a DVD, a magneto-optical disc such as an MO and a semiconductor memory such as a USB memory and a memory card) recording the above-described program and then installing the program in the general-purpose computer using the external memory device 307. Also, a method of supplying the program to the computer is not limited to supplying via the external memory device 307. For example, a communication line such as the Internet or an exclusive line may be used to supply the program without the external memory device 307. Also, the memory unit 301 or the external memory device 307 is configured as a non-transitory computer-readable recording medium. Hereinafter, these are also collectively simply called a recording medium. Also, when the term "recording medium" is used in this specification, it refers to either the memory unit 301 or the external memory device 307 or both thereof.

Next, a structure in the vicinity of the susceptor 217 and an operation of the susceptor 217 will be described with reference to FIG. 3.

The housing 101 of the first transfer chamber 103 is adjacently provided in the reaction container 203 via any one of the gate valves 150 through 153. For example, the housing 101 of the first transfer chamber 103 communicates with the reaction container 203 by opening the gate valve 151. The first substrate transfer device 112 transfers the substrate 200 between the substrate support unit 217b of the susceptor 217 via the second substrate transfer device 124 from the pod 100.

Here, a plurality of substrate support units 217b that place the substrate 200 are formed in the susceptor 217. In the present embodiment, five substrate support units 217b are provided at equal intervals in a clockwise direction (for example, an interval of 72°) and the substrate support units 217b(1) to 217b(5) rotate in a collective manner by rotating the susceptor 217.

(3) Teaching Process

Next, a teaching process that is one of initial settings of the substrate processing apparatus 10 will be described with reference to FIG. 6. The teaching refers to, for example, registering an operating position of the first substrate transfer device 112. Specifically, tweezers 113 of the first substrate transfer device 112, for example, the tweezers 113 when the substrate 200 is placed on the substrate support unit 217b obtain appropriate position information to register in the memory unit 301. The position information includes, for example, position information in X and Y directions in a plane (horizontal plan=XY plane of FIG. 1) including back and forth directions of the tweezers 113 and position information in a direction (vertical direction=Z direction) perpendicular to the XY plane. The Z direction is a direction in which the first substrate transfer device elevator 115 lifts. Also, the position information is provided as an encoder value of a motor of an arm 114 of the first substrate transfer device 112 as described below.

In the initial setting of the substrate processing apparatus 10, the teaching is performed on at least the first substrate transfer device 112. Preferably, the teaching is also performed on the second substrate transfer device 124. In the first substrate transfer device 112, an operating position in each of the process chambers 202a, 202b, 202c and 202d and an operating position in each of the spare chambers 122 and 123 are registered. In the second substrate transfer device 124, an operating position in the pod 100 and an operating position in each of the spare chambers 122 and 123 are registered.

Here, the teaching process when the first substrate transfer device 112 moves a wafer that is a substrate to the second process chamber 202b will be described. Also, since the teaching process when the first substrate transfer device 112 moves the wafer to the first process chamber 202*a*, the third process chamber 202*c* and the fourth process chamber 202*d* is the same as a case of the process chamber 202*b*, description thereof will not be repeated.

The teaching process is controlled by an operator using a manual controller referred to as a pendant. The manual controller may be connected and detachable to the control unit 300. A manual program for performing a control by the manual controller is stored in the memory unit 301 of the control unit 300. The CPU 302 receives an operating input from the manual controller and controls each of components of the substrate processing apparatus 10 based on the manual program.

[First Teaching Process]

A first teaching is performed in a standby state after the installation or maintenance of the apparatus is completed and before the first transfer chamber 103 and the process chamber 202*b* become in a vacuum state. In this state, since the first teaching can be performed in a state in which an upper cover of the first transfer chamber 103 or the process chamber 202*b* is opened, it is easy to determine a position of the wafer with naked eye. First, the susceptor 217 is rotated by the rotating mechanism 267 so that the substrate support unit 217*b*(1) is adjacent to the gate valve 151 using the manual controller and then is stopped. A susceptor stopping mechanism that determines a stop position of the susceptor 217 is provided at each of positions at which the substrate support units 217*b*(1) to 217*b*(5) of the reaction container 203 are adjacent to the gate valve 151. The susceptor stopping mechanism includes a position detecting sensor that detects a rotation position of the susceptor 217 and a stopper such as a stop plate or the like that regulates a stop position. Each of the substrate support units 217*b*(1) to 217*b*(5) stops at the same position by the susceptor stopping mechanism.

Next, the tweezers 113 of the first substrate transfer device 112 are moved toward the substrate support unit 217*b*(1) by the manual controller. In this case, the wafer is manually placed on the tweezers 113, for example, at a predetermined accurate position by the operator. Also, as illustrated in FIG. 6, a path is regulated so that a center 200*a* of the wafer placed on the tweezers 113 passes through a center between the two sensors 117*a* and 117*b* along a straight line 117*c*. That is, the straight line 117*c* is a moving path of the center 200*a* of the wafer.

The straight line 117*c* is a straight line that connects a position (see FIG. 1) at which the tweezers 113 of the first substrate transfer device 112 recede most to the substrate support unit 217*b*(1). Specifically, when the wafer is placed at the accurate position on the tweezers 113, the straight line 117*c* is a straight line that connects the center of the wafer when the tweezers 113 recede most to the center of the wafer when the wafer on the tweezers 113 is placed at an accurate position on the substrate support unit 217*b*(1). Also, the position in which the tweezers 113 recede most is a position of the tweezers 113 in FIG. 1, that is, a position in which the tweezers 113 are farthest from the substrate support unit 217*b*(1) on the straight line 117*c*.

When the tweezers 113 move onto the substrate support unit 217*b*(1) and the wafer on the tweezers 113 reaches the accurate position, that is, when the tweezers 113 reach the accurate position at which the wafer will be placed on the substrate support unit 217*b*(1), position information on the tweezers 113 at this position is stored in the memory unit 301 by the manual controller. When a predetermined position on an axis (axis in a Z direction in which a horizontal rotating operation is possible in an XY plane of the arm 114) of the arm 114 is as a reference position, the position information on the tweezers 113 is, for example, information identified by coordinates in which the arm moves from the reference position. Specifically, when a value in a state in which the tweezers 113 recede most (state on the first substrate transfer device elevator 115, see FIG. 1) is as a reference value, an encoder value of the motor that moves the arm 114 is an encoder value when the tweezers 113 reach at the accurate position at which the wafer will be placed on the substrate support unit 217*b*(1), for example, position information on the tweezers 113 in the substrate support unit 217*b*(1).

In this manner, after the position information on the tweezers 113 in the substrate support unit 217*b*(1) is stored in the memory unit 301, the susceptor 217 is rotated by the rotating mechanism 267 using the manual controller so that the substrate support unit 217*b*(2) is adjacent to the gate valve 151 and then is stopped. That is, the substrate support unit 217*b*(2) moves to a position at which the substrate support unit 217*b*(1) was present. In this case, since there is no guarantee that the position at which the substrate support unit 217*b*(1) was present is exactly the same position as a position after the substrate support unit 217*b*(2) moves due to mechanical limit or movement accuracy, the teaching is also performed on the substrate support unit 217*b*(2).

The tweezers 113 of the first substrate transfer device 112 are moved toward the substrate support unit 217*b*(2) by the manual controller, similar to that in the teaching of the substrate support unit 217*b*(1). When the tweezers 113 reach the position at which the wafer will be placed on the substrate support unit 217*b*(2), the position information on the tweezers 113 at this position is stored in the memory unit 301 by the manual controller.

In the same manner, with respect to the substrate support unit 217*b*(3) to the substrate support unit 217*b*(5), position information on the tweezers 113 in the substrate support unit 217*b* is stored in the memory unit 301 by the manual controller. In this manner, a moving path of the first substrate transfer device 112 sets. Hereinafter, the position information on the tweezers 113 at the position at which the wafer will be placed on the substrate support unit 217*b* is referred to as teaching data.

[Second Teaching Process]

Next, the substrate processing apparatus 10 becomes in a state close to during the substrate processing. Specifically, the first transfer chamber 103 becomes in a vacuum state, the second process chamber 202*b* becomes in a vacuum state and the substrate becomes in a heated state by supplying power to the heater 218. Since the state, such as, temperature, pressure or the like, of the substrate processing apparatus 10 during the substrate processing is different from that of the state in the first teaching process, the positions of the tweezers 113 during the substrate processing are different from that in the first teaching process. Therefore, the position information (first teaching data) of the tweezers 113 in the first teaching process is modified in the second teaching process performed in the state close to during the substrate processing. Since the upper cover of the first transfer chamber 103 or the process chamber 202*b* is closed in the second teaching process, it is difficult to determine the position of the wafer with naked eye. However, since the first teaching data is used, a range in which the position of the wafer is determined with naked eye may be reduced. As a result, it is possible to efficiently perform the teaching in the state during the substrate processing by performing both the first and second teachings.

Next, under a condition almost similar to that during the substrate processing, the tweezers 113 of the first substrate transfer device 112 are moved toward the substrate support unit 217b(1) by the manual controller. In this case, the wafer is manually placed on the tweezers 113, for example, at a predetermined accurate position by an operator and the tweezers 113 move based on the first teaching data. After the tweezers 113 move based on the first teaching data, the tweezers 113 reach the position at which the wafer will be placed on the substrate support unit 217b(1) by regulating the positions of the tweezers 113 while the position of the wafer is determined with naked eye using the manual controller. After the tweezers 113 move onto the substrate support unit 217b(1) and the wafer reaches at an accurate position on the tweezers 113, that is, after the tweezers 113 reach an accurate position (support unit reference position) at which the wafer will be placed on the substrate support unit 217b(1), position information (encoder value of motor of the substrate transfer device 112) of the tweezers 113 at this position is stored in the memory unit 301 by the manual controller as second teaching data T1 (first reference position information s1) with respect to the substrate support unit 217b(1). In this manner, the support unit reference position is a reference position of the substrate transfer device 112 (that is, tweezers 113) in the substrate support unit 217b and the reference position information s1 is information that represents the support unit reference position.

In this manner, position information (second teaching data) of the tweezers 113 in the substrate support unit 217b(1) is stored in the memory unit 301 and then the susceptor 217 is rotated by the rotating mechanism 267 using the manual controller so that the substrate support unit 217b(2) is adjacent to the gate valve 151. In this case, since there is no guarantee that the position at which the substrate support unit 217b(1) was present is exactly the same position as a position after the substrate support unit 217b(2) moves due to mechanical limit or movement accuracy, the teaching is also performed on the substrate support unit 217b(2), similar to the first teaching.

The tweezers 113 of the first substrate transfer device 112 are moved toward the substrate support unit 217b(2) by the manual controller, similar to the second teaching of the substrate support unit 217b(1). Then, when the positions of the tweezers 113 are regulated with naked eye using the manual controller and the tweezers 113 reach the position at which the wafer will be placed on the substrate support unit 217b(2), position information on the tweezers 113 at this position is stored in the memory unit 301 by the manual controller as the second teaching data T2 (second reference position information s1) with respect to the substrate support unit 217b(2).

In the same manner, with respect to the substrate support unit 217b(3) to the substrate support unit 217b(5), third to fifth reference position information s1 that is position information on the tweezers 113 (second teaching data T3 to T5) is stored. In this manner, second teaching data Tn ($n^{th}$ support unit reference position information s1) with respect to the substrate support unit 217b(n) is stored. In this manner, the moving path is set to be suitable for an environment during the substrate processing than the moving path set in the first teaching.

Coordinate values of the reference position information s1 that is position information on the tweezers 113 at the position at which the wafer will be placed on the substrate support units 217b(1) to 217b(n), for example, XY coordinate values are calculated based on information on the second teaching data T1 to Tn (n corresponds to n of the substrate support unit 217b(n) and encoder value) and are stored in the memory unit 301. The reference position information s1 refers to a reference position of the first substrate transfer device 112 for placing the wafer in each of the plurality of substrate support units 217b. In this manner, the reference position information s1 is set as the first reference position information s1 to the $n^{th}$ reference position information s1 (n corresponds to n of the substrate support unit 217b(n)) corresponding to the substrate support units 217b(1) to 217b(n).

Next, a method of obtaining a difference between the reference position information s1 in each of the substrate support units 217b(2) to 217b(n) and the first reference position information s1 in the substrate support unit 217b(1) will be described. The difference information is used to obtain substrate reference position information sk, substrate placing position information s3 or the like. Difference information between the first reference position information s1 in the substrate support unit 217b(1) and the second reference position information s1 in the substrate support unit 217b(2) is a difference (encoder value) between the second teaching data T1 and T2. In the same manner, difference information between the first reference position information s1 and the $n^{th}$ reference position information s1 in the substrate support unit 217b(n) is a difference (encoder value) between the second teaching data T1 and Tn. Also, it is not necessary to calculate the difference information in the teaching process and the difference information may be calculated in a substrate reference position information sk obtaining process or a substrate placing position information s3 obtaining process to be described below. It is possible to further efficiently and accurately calibrate the position using the difference information so as to fit the substrate support unit 217b that rotates in the substrate reference position information sk obtaining process or a substrate placing position calibration process to be described below.

(4) Process of Obtaining Substrate Reference Position Information sk in Wafer Moving Path Next, as one of initial settings performed after the teaching process, a process of obtaining substrate reference position information sk that is reference position information on the substrate on a wafer moving path will be described. The process of obtaining the substrate reference position information sk is performed for the following purposes. In advance, position information (substrate reference position information sk) of the wafer that is supported at accurate positions of the tweezers 113, that is, at an appropriate position is obtained at a reference position (path unit reference position) of the tweezers 113 on the wafer moving path. Then, position information p of the wafer at the path unit reference position is obtained during the substrate transferring for the substrate processing and the obtained position information p of the wafer is compared with the substrate reference position information sk. Thus, a position deviation degree d of the wafer during the substrate transferring for the substrate processing from the substrate reference position information sk is detected. Based on the position deviation degree d of the wafer, the substrate support unit 217b places the wafer at an appropriate position. Since the position deviation of the wafer typically occurs within a horizontal plane (XY plane) but does not occur in a Z-axis direction, the process of obtaining the substrate reference position information sk within the horizontal plane (XY plane) will be described here. Thus, the path unit reference position is a reference position of the first substrate transfer device 112 (that is, tweezers 113) on the wafer moving path and the substrate reference position information sk is information that represents a reference position of the wafer being transferred in the first transfer chamber 103.

Although the operation of the first substrate transfer device 112 is controlled by the manual controller in the teaching process, the control unit 300 controls the operation of the first substrate transfer device 112 based on the second teaching data in the process of obtaining the substrate reference position information sk.

The process of obtaining the substrate reference position information sk is performed in a state in which the substrate processing apparatus 10 is close to during the substrate processing. Specifically, the first transfer chamber 103 becomes in a vacuum state, the process chamber 202b becomes in a vacuum state and the substrate becomes in a heated state by supplying power to the heater 218. Also, the sensor 117 operates.

Hereinafter, the process of obtaining the substrate reference position information sk will be described in detail. First, the process of obtaining the substrate reference position information sk with respect to the substrate support unit 217b(1) will be described.

Based on an instruction of the operator on a control unit of the control unit 300, the susceptor 217 is rotated and stopped by the rotating mechanism 267 so that the substrate support unit 217b(1) is adjacent to the gate valve 151.

Next, the control unit 300 moves the tweezers 113 that supports the wafer at an accurate position toward the substrate support unit 217b(1). Based on the first reference position information s1 (second teaching data T1) of the tweezers 113 that is obtained by the above-described teaching process, the center 200a of the wafer passes between the two sensors 117a and 117b along a path set by the first reference position information s1 as illustrated in FIG. 6.

When the sensor 117a and the sensor 117b each detects edges of the wafer that are ends of the wafer, the control unit 300 stores position information (for example, XY coordinate values) of a center position A of the wafer at a time t1 detected by the sensor 117a as the substrate reference position information sk (first substrate reference position information sk) on the wafer moving path toward the substrate support unit 217b(1) in the memory unit 301 based on a time difference t between the time t1 detected by the sensor 117a and a time t2 detected by the sensor 117b. In this case, position information (path unit reference position information s2=encoder value ek) of the tweezers 113 at the time t1 detected by the sensor 117a is stored in the memory unit 301 by corresponding to the substrate reference position information sk. The encoder value ek includes encoder values in X and Y directions within the XY plane. Also, the positions of the tweezers 113 at the time t2 detected by the sensor 117b may be the path unit reference position.

Specifically, the control unit 300 detects a wafer edge C at the time t1 using the sensor 117a and a wafer edge D at the time t2 using the sensor 117b. Although a movement speed of the tweezers 113 is delayed when the movement starts and ends, the movement speed always has a constant value V in the vicinity of a boundary between the first transfer chamber 103 and process chamber 202. Also, a movement direction of the wafer is a direction parallel to the moving path 117c. Positions of the sensor 117a and the sensor 117b and a size (radius) of the wafer having a circular shape are known. A position of the wafer edge C at the time t1 is a position in which the wafer edge C starts to overlap the sensor 117a.

Therefore, a position of the wafer edge D at the time t1 may be obtained based on the movement speed V of the tweezers 113 and the time difference between the time t1 and the time t2. Also, a position of a center A of the wafer at the time t1 may be obtained based on the positions of the wafer edges C and D at the time t1 and the size of the wafer having a circular shape. That is, the position information (substrate reference position information sk) of the center A may be obtained based on the time difference between the time t1 and the time t2. The position information on the center A may be represented as, for example, the coordinate values (xk, yk) of the XY coordinates illustrated in FIG. 6.

In this manner, the substrate reference position information sk (first substrate reference position information sk) is obtained at the path unit reference position with respect to the substrate support unit 217b(1) of the process chamber 202b to be stored in the memory unit 301 by corresponding to the position information on the tweezers 113 (path unit reference position information s2=encoder value ek) at the path unit reference position.

Next, the process of obtaining the substrate reference position information sk ($n^{th}$ substrate reference position information sk) with respect to the substrate support unit 217b(n) will be described. As described above with respect to the substrate support unit 217b(1), the first substrate reference position information sk is obtained by moving the tweezers 113 using the first reference position information s1. In the process of obtaining the $n^{th}$ substrate reference position information sk with respect to the substrate support unit 217b(n), the $n^{th}$ substrate reference position information sk is calculated using the first reference position information s1 and the $n^{th}$ reference position information s1 without moving of the tweezers 113. That is, the $n^{th}$ substrate reference position information sk is calculated based on difference information between the first reference position information s1 and the $n^{th}$ reference position information s1 and the first reference position information s1. For example, the $n^{th}$ substrate reference position information sk is obtained by converting the difference information (encoder value) between the first reference position information s1 and the $n^{th}$ reference position information s1 into the XY coordinate values and adding the XY coordinate values of the first reference position information s1. In this manner, by calculating the substrate reference position information sk of the substrate support unit 217b(2) to the substrate support unit 217b(5) (the second substrate reference position information sk to the fifth substrate reference position information sk), when the substrate reference position information sk of the substrate support unit 217b(2) to the substrate support unit 217b(5) is obtained, there is no need to obtain data by substantially moving the tweezers 113 and thus it is possible to reduce time of collecting the substrate reference position information sk.

With respect to the other process chambers 202a, 202c and 202d like the process chamber 202b, the substrate reference position information sk at the path unit reference position (encoder value ek) is obtained and stored in the memory unit 301 by corresponding to the path unit reference position information s2 (the encoder value ek) that is the position information on the tweezers 113 at the path unit reference position.

Also, when the wafer on the tweezers 113 is deviated from the accurate position during the substrate transferring for the substrate processing to be described below, wafer position deviation information on the tweezers 113 is obtained based on wafer position information p (for example, XY coordinate values (x, y)) on the tweezers 113 detected from the path unit reference position (encoder value ek) during the substrate transferring and the substrate reference position information sk (xk and yk). Also, accurate position information (substrate placing position information s3) of the tweezers 113 in which the wafer will be placed is obtained based on the wafer position deviation information and the reference position information s1. Also, the tweezers 113 move to an accurate position in which the wafer will be placed on the substrate support unit 217$b$(1) based on the substrate placing position information s3.

Here, the wafer position information p detected during the substrate transferring for the substrate processing, the wafer position deviation information and the substrate reference position information sk may be represented as, for example, XY coordinate values. Also, the reference position information s1, the path unit reference position information s2 and the substrate placing position information s3 may be represented as the encoder value of the motor of the first substrate transfer device 112. Here, a conversion table that represents a relationship between the XY coordinate values and the encoder value is stored in the memory unit 301 in advance. The control unit 300 converts the wafer position deviation information obtained during the substrate processing into the encoder value to obtain the substrate placing position information s3.

(5) Substrate Processing Process

Hereinafter, a processing process using the substrate processing apparatus 10 including the above configuration will be described. The following process is controlled by the controller 300 as illustrated in FIGS. 1 and 2. The controller 300 controls the entire apparatus in the above configuration.

[Substrate Transferring Process]

A maximum of 25 substrates 200 (200(1) to 200(25)) that are accommodated in the pod 100 are transferred by an in-process transfer device to the substrate processing apparatus 10 on which the processing process is performed. As illustrated in FIGS. 1 and 2, the transferred pod 100 is received from the in-process transfer device to be placed on the load port 105. The cap 100$a$ of the pod 100 is removed by the pod opener 108 to open a substrate entrance of the pod 100.

When the pod 100 is opened by the pod opener 108, the second substrate transfer device 124 provided in the second transfer chamber 121 pickups the first substrate 200(1) from the pod 100 to load into the spare chamber 122 and transfers the substrate 200(1) into the substrate support 140. During the transferring process, the gate valve 126 in the first transfer chamber 103 of the spare chamber 122 is closed and a negative pressure in the first transfer chamber 103 is maintained. When the substrate 200(1) accommodated in the pod 100 is transferred to the substrate support 140, the gate valve 128 is closed and an inside of the spare chamber 122 is exhausted at a negative pressure by an exhaust device (not illustrated).

When the inside of the spare chamber 122 becomes to have a preset pressure value, the gate valve 126 is opened and the spare chamber 122 communicates with the first transfer chamber 103. Next, the first substrate transfer device 112 of the first transfer chamber 103 loads the substrate 200 from the substrate support 140 into the first transfer chamber 103.

After the gate valve 126 is closed, the gate valve 151 is opened and the first transfer chamber 103 communicates with the second process chamber 202$b$. In this case, the rotating mechanism 267 regulates a rotational position of the susceptor 217 so that the substrate support unit 217$b$(1) is adjacent to and opposite to the gate valve 151.

The first substrate transfer device 112 moves the first substrate 200(1) to place to the substrate support unit 217$b$(1) based on substrate placing position information s3(1) obtained by the substrate placing position calibration process to be described below.

After the gate valve 151 is closed, the $n^{th}$ substrate 200($n$) is placed to the first substrate transfer device 112 via the spare chamber 122 like the substrate 200(1). At the same time, the rotating mechanism 267 regulates the rotational position of the susceptor 217 so that the substrate support unit 217$b$($n$) is adjacent to the gate valve 151.

The first substrate transfer device 112 moves the $n^{th}$ substrate 200($n$) to place to the substrate support unit 217$b$($n$) based on substrate placing position information s3($n$) obtained by the substrate placing position calibration process to be described below.

After the substrate 200 is placed to each substrate support unit 217$b$, the processing gas is supplied into the second process chamber 202 and a desired processing such as a heating processing is performed on each substrate 200.

When a processing of the substrate 200 in the second process chamber 202$b$ is completed, the gate valve 151 is opened and the substrate 200 is unloaded to the first transfer chamber 103 by the first substrate transfer device 112. After the unloading, the gate valve 151 is closed.

Next, the gate valve 126 is opened, the first substrate transfer device 112 transfers the substrate 200 unloaded from the second process chamber 202$b$ to the substrate support 140 of the spare chamber 123 and the processed substrate 200 is cooled.

The processed substrate 200 is transferred into the spare chamber 123 and the spare chamber 123 is returned to a substantially atmospheric pressure by an inert gas when a preset cooling time has elapsed. When an inside of the spare chamber 123 is returned to the substantially atmospheric pressure, the gate valve 129 is opened and a cap 100$a$ of an empty pod 100 that is placed on the load port 105 is opened by the pod opener 108.

Next, the second substrate transfer device 124 of the second transfer chamber 121 unloads the substrate 200 from the substrate support 140 to the second transfer chamber 121 to store in the pod 100 through the substrate loading and unloading port 134 of the second transfer chamber 121.

Here, the cap 100$a$ of the pod 100 may be continuously opened until a maximum of 24 substrates are returned and may be returned to the pod from which the substrate is unloaded, without storing in the empty pod 100.

When the 25 processed substrates 200 is stored in the pod 100 by repeating the operation, the cap 100$a$ of the pod 100 is closed by the pod opener 108. The closed pod 100 is transferred from the load port 105 to the next process by an in-process transfer device.

The above operation has exemplified a case in which the second process chamber 202$b$ and the spare chambers 122 and 123 are used. However, the same operation may be performed in a case in which the first process chamber 202$a$, the third process chamber 202$c$ and the fourth process chamber 202$d$ are used.

Also, here, it has been described that four process chambers are used, but the present invention is not limited thereto and the number of the process chambers may be determined according to the type of corresponding substrate or formed film.

Also, in the above-described substrate processing apparatus, the spare chamber 122 is provided for loading and the spare chamber 123 is provided for unloading. However, the spare chamber 123 may be provided for loading and the spare chamber 122 may be provided for unloading, or the spare chamber 122 or the spare chamber 123 may be configured to have functions of both unloading and unloading.

Also, when the spare chamber 122 or the spare chamber 123 is dedicated for loading or unloading, cross contamination may be decreased. When the functions of both loading and unloading are provided, transfer efficiency of the substrate may be improved.

Also, the same process may be performed in all the process chambers and different processes may be performed in each of the process chambers. For example, when different processes are performed in the first process chamber 202a and the second process chamber 202b, a predetermined process is performed on the substrate 200 in the first process chamber 202a and then another process may be performed in the second process chamber 202b. When the predetermined process is performed on the substrate 200 in the first process chamber 202a and then another process is performed in the second process chamber 202b, the spare chamber 122 or the spare chamber 123 may be passed through.

Also, in the process chamber, at least any of the process chambers 202a and 202b may be connected and several chambers may be connected in combinations as long as a maximum of four chambers, the process chambers 202a through 202d, can be combined, for example, two chambers, the process chambers 202c and 202d.

Also, one or a plurality of substrates may be processed in the apparatus. In the same manner, one or a plurality of substrates may be cooled in the spare chambers 122 or 123. The number of the processed substrates to be concurrently cooled may be in any combinations as long as a maximum of four substrates can be input to slots of the spare chambers 122 and 123.

Also, during performing the loading and cooling of the processed substrate in the spare chamber 122, the substrate may be loaded into the process chamber by opening and closing the gate valve of the spare chamber 122 and the processing of the substrate may be performed. In the same manner, during performing the loading and cooling of the processed substrate in the spare chamber 123, the substrate may be loaded into the process chamber by opening and closing the gate valve of the spare chamber 123 and the processing of the substrate may be performed.

Here, when the gate valve of substantially atmospheric side is opened without a sufficient cooling time, it is possible to damage electrical components connected to the spare chambers 122 or 123 or the vicinity of the spare chamber by radiant heat of the substrate 200. Thus, when the substrate having a high temperature is cooled, the gate valve of the spare chamber 123 is opened and closed during performing the cooling by loading the processed substrate having a high radiant heat into the spare chamber 122, the substrate is loaded into the process chamber and the processing of the substrate may be performed. In the same manner, the gate valve of the spare chamber 122 is opened and closed during performing the cooling by loading the processed substrate into the spare chamber 123, the substrate is loaded into the process chamber and the processing of the substrate may be performed.

[Substrate Placing Position Calibration Process]

Figure 7:
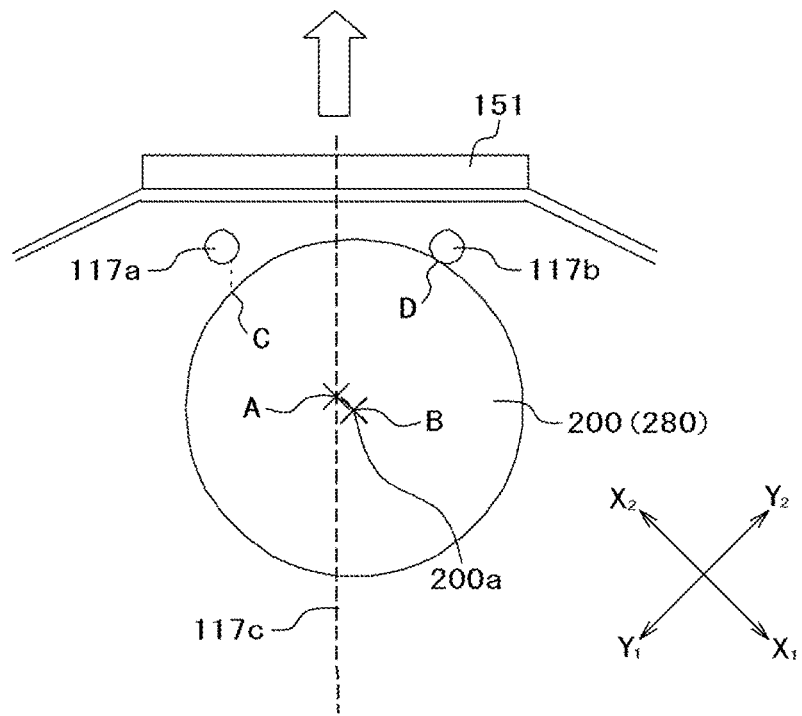
FIG. 7 is a view illustrating a position deviation of a wafer according to the first embodiment of the present invention.

When the plurality of the wafers (substrates 200) are processed, components such as the tweezers 113, the arm 114 or the like may be deformed with time. In this case, for example, as illustrated in FIG. 7, since the wafer is deviated from an original position on the tweezers 113 within the horizontal plane (XY plane), it is considered that the wafer is deviated from the original moving path 117c of the wafer. FIG. 7 is a view illustrating a position deviation of a wafer according to the first embodiment. When the wafer on the tweezers 113 is deviated from the moving path 117c between the sensor 117a and the sensor 117b, the substrate support unit 217b may not place the wafer at an appropriate position in the state.

Thus, when the wafer on the tweezers 113 is deviated from the original position, the following substrate placing position calibration process is performed while the wafer is transferred to the susceptor 217. In FIG. 7, reference numeral B represents a position of the center of the wafer when the tweezers 113 are located at the above-described path unit reference position during the wafer transferring for the substrate processing (in this case, time tk), that is, when an encoder value of the motor of the first substrate transfer device 112 represents ek. Reference numeral A that is a position of reference numeral A illustrated in FIG. 6 represents a central position of the wafer when the tweezers 113 are located at the path unit reference position (encoder value ek) in the process of obtaining the above-described substrate reference position information sk. In FIG. 7, the center 200a of the wafer at the path unit reference position is deviated from the reference numeral A that is an original accurate position to the reference numeral B. Here, FIG. 6 is a view illustrating a state in which the components such as the tweezers 113, the arm 114 or the like are not deformed and FIG. 7 is a view illustrating a state in which the components such as the tweezers 113, the arm 114 or the like are deformed. Therefore, even when the tweezers 113 or the arm 114 are moved using the path unit reference position information s2 in each state, the position of the wafer is deviated.

The control unit 300 may detect whether the wafer is present or not using the sensor 117a and the sensor 117b, that is, the edges of the wafer. Here, the control unit 300 detects the wafer edge D at a time t11 using the sensor 117b and the wafer edge C at a time t12 using the sensor 117a. The above-described time tk may be different from the time t11 or the time t12. As described above, the movement speed of the tweezers 113 always has the constant value V in the vicinity of the boundary between the first transfer chamber 103 and process chamber 202. Also, the movement direction of the wafer is a direction of the moving path 117c. Reference numeral C is an edge of the wafer when the sensor 117a detects and reference numeral D is an edge of the wafer when the sensor 117b detects. The positions of the sensor 117a and the sensor 117b and the size (radius) of the wafer having a circular shape are known. A position of the wafer edge D at the time t11 is a position in which the wafer edge D starts to overlap the sensor 117a.

Therefore, it is possible to know the movement speed V of the tweezers 113 and the position of the wafer edge C at the time t11 based on the time difference between the time t11 and the time t12. Also, it is possible to know the positions of the wafer edges C and D at the time t11 and a position of the reference numeral B at the time t11 based on the size of the wafer having a circular shape. Also, it is possible to know the time difference between the time tk when the tweezers 113 reach the path unit reference position and the time t11 and the position of the reference numeral B when the tweezers 113 are located at the path unit reference position based on the movement speed V of the tweezers 113. That is, position information on a position B of the center of the wafer at the path unit reference position may be obtained based on the time difference between the time t11 and the time t12 and the time difference between the time tk and the time t11. The position information on the reference numeral B is detected position information that represents the position of the wafer detected using a substrate position detecting unit including the sensor 117 and the control unit 300 and may be represented as the XY coordinates (x, y).

In this manner, the control unit 300 obtains coordinates (dx, dy) of a position deviation degree d of the wafer that is a difference between position information (xk, yk) of the reference numeral A and the position information (x, y) of the reference numeral B at the path unit reference position. Also, when the position deviation degree d of the wafer is within a predetermined range, for example, when the position deviation degree d of the wafer is less than 2 mm, the substrate placing position information s3 that is the position information on the tweezers 113, in which the wafer will be placed on the substrate support unit 217b, during the substrate processing is obtained based on the position deviation degree d of the wafer and the reference position information s1. In this case, the position deviation degree d of the wafer is converted into an encoder value ed. For example, when an encoder value of the reference position information s1 is et and the value converted into the encoder value of the position deviation degree d of the wafer at the path unit reference position is ed, the substrate placing position information s3 in which the wafer will be placed during the substrate processing becomes et+ed.

Also, the coordinates (dx, dy) of the position deviation degree d becomes, for example, positive when the reference numeral B is deviated in an $X_1$ direction or a $Y_2$ direction and becomes negative when the reference numeral B is deviated in an $X_2$ direction or a $Y_1$ direction. For example, when the reference numeral B is deviated in the $X_1$ direction by 0.5 mm and the $Y_1$ direction by 0.1 mm, the coordinates (dx, dy) of the position deviation degree d becomes (+0.5 mm, −0.1 mm).

As described above, a conversion table in which the XY coordinate values such as the position deviation degree d of the wafer is converted into the encoder value of the motor of the first substrate transfer device 112 is stored in the memory unit 301. The control unit 300 obtains the encoder value of the position deviation degree d of the wafer using the conversion table. Also, the substrate placing position information s3 is obtained based on the deviation degree ed of the wafer converted into the encoder value and the reference position information s1 (encoder value et), and the tweezers 113 are moved at the accurate position in which the wafer will be placed on the substrate support unit 217b based on the substrate placing position information s3.

In the present embodiment, a diameter of the substrate support unit 217b having a circular shape is set greater than a diameter of the wafer having a circular shape by a predetermined range, specifically, by 4 mm, that is, a difference between the diameter of the substrate support unit 217b and the diameter of the wafer is set to 4 mm. Therefore, when the position deviation degree d of the wafer is less than 2 mm, the wafer is not deviated from the substrate support unit 217b and thus the substrate processing may be appropriately performed. Also, when the position deviation degree d of the wafer is not within the predetermined range, the control unit 300 stops the substrate transferring operation and displaying that indicates failure is performed on a display unit of the control unit 300.

As describe above, the control unit 300 generates detected position information that represents the position of the wafer being transferred in the first transfer chamber 103 based on the information whether the wafer is present or not detected using the sensor 117 during the substrate processing. Also, the control unit 300 controls a position in which the first substrate transfer device 112 places the substrate on the plurality of substrate support units 217b based on the detected position information, the reference position information s1 and the substrate reference position information sk. Also, when a difference between the detected position information and the substrate reference position information sk is within a predetermined range, the control unit 300 controls to calibrate the position in which the first substrate transfer device 112 places the wafer on the plurality of substrate support units 217b based on the difference between the detected position information and the substrate reference position information sk. Also, when the difference between the detected position information and the substrate reference position information sk is out of the predetermined range, the control unit 300 controls to stop the transferring operation of the first substrate transfer device 112.

[Substrate Processing Process in Process Chamber]

Figure 8:
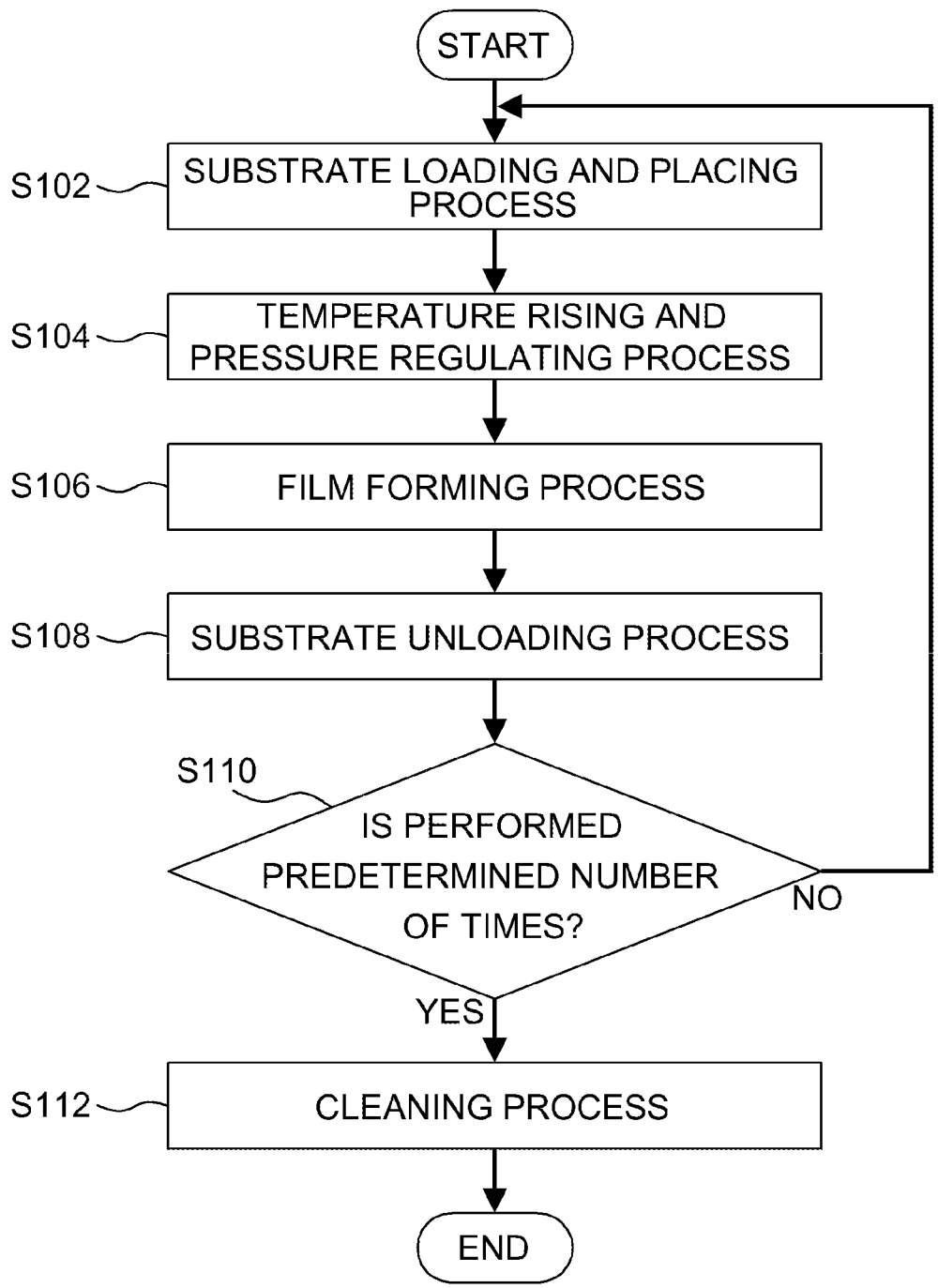
FIG. 8 is a flowchart for describing a substrate processing process according to the first embodiment of the present invention.
Figure 9:
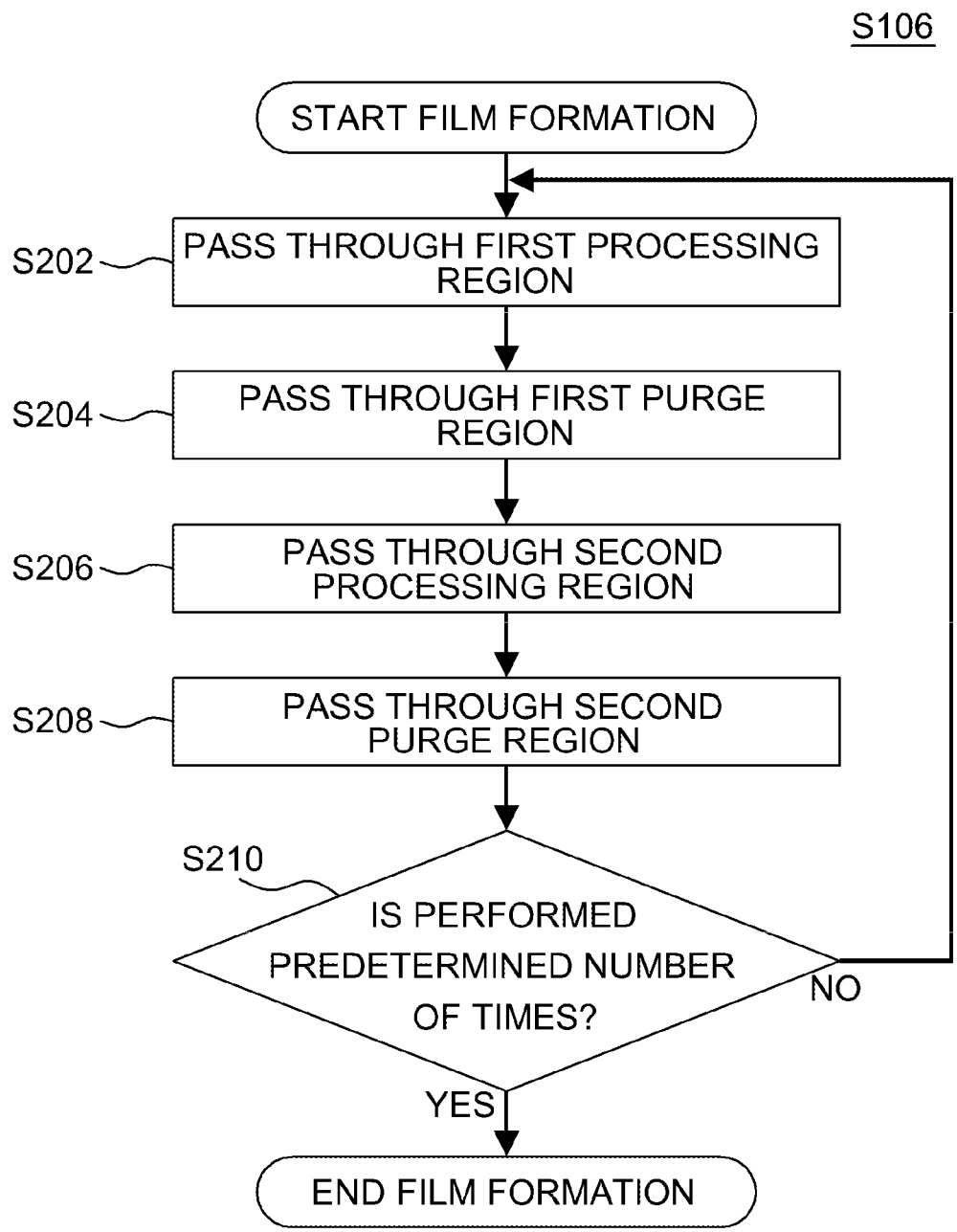
FIG. 9 is a flowchart for describing a film forming process according to the first embodiment of the present invention.
Figure 10:
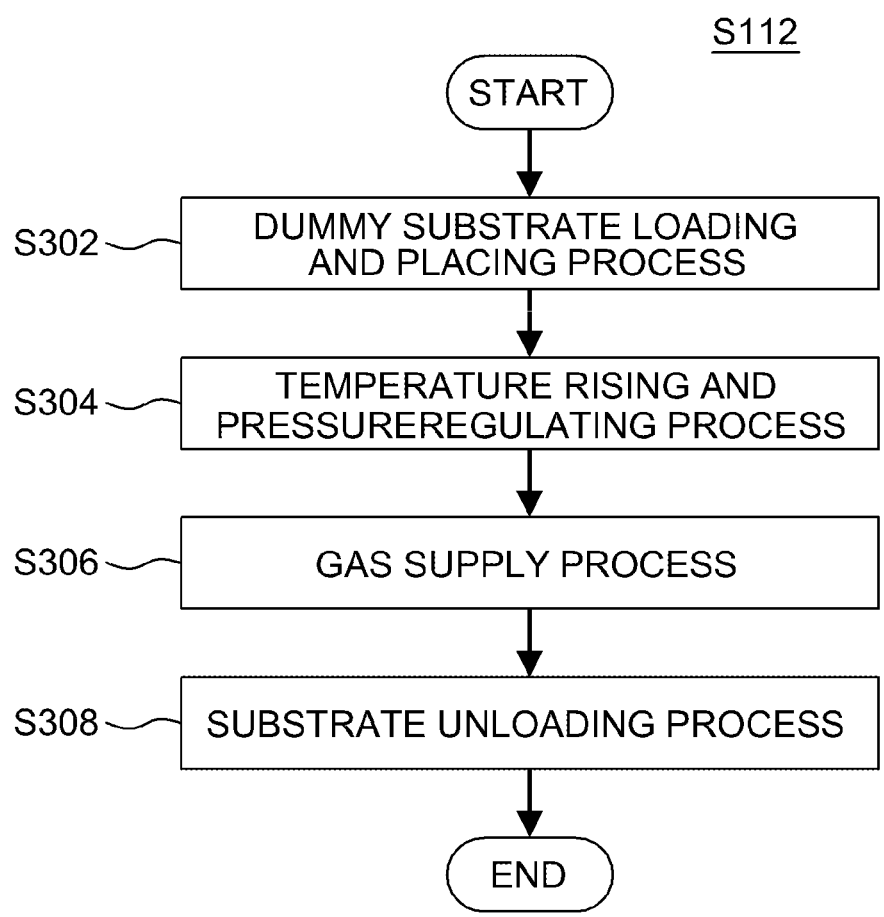
FIG. 10 is a flowchart for describing a cleaning process according to the first embodiment of the present invention.

Next, as one of processes of manufacturing a semiconductor device according to the embodiment, the substrate processing process exemplified using the process chamber 202a including the above-described reaction container 203 will be described with reference to FIGS. 8 through 10. FIG. 8 is a flowchart illustrating the substrate processing process according to the first embodiment. FIG. 9 is a flowchart illustrating a process of processing the substrate in a film forming process in the substrate processing process according to the first embodiment. FIG. 10 is a flowchart illustrating a cleaning process in the substrate processing process according to the first embodiment. Also, in the following description, the operation of each configuration unit of the process chamber 202 of the substrate processing apparatus 10 is controlled by the control unit 300.

Here, an example in which trisilylamine (TSA) that is a silicon-containing gas is used as the first gas and the oxygen gas that is an oxygen-containing gas is used as the second processing gas to form a silicon oxide film (SiO film) serving as an insulating film on the substrate 200 will be described. In advance, the reference position information s1 (second teaching data) that is the position information on the tweezers 113 in the substrate support unit 217b is obtained by the teaching process in advance. Also, the substrate reference position information sk on the wafer moving path is obtained.

[Substrate Loading and Placing Process (S102)]

First, the substrate lift pin 266 is raised to a transfer position of the substrate 200 and the substrate lift pin 266 penetrates the through hole 217a of the susceptor 217. As a result, the substrate lift pin 266 protrudes from the surface of the susceptor 217 in a predetermined height. Subsequently, the gate valve 151 is opened and a predetermined number (for example, five) of substrates 200 (substrates to be processed) are loaded into the reaction container 203 using the first substrate transfer device 112. Then, about an axis of rotation (not illustrated) of the susceptor 217, the substrates 200 are placed not to be stacked on the same plane as the susceptor 217. Accordingly, the substrate 200 is supported in a horizontal posture on the substrate lift pin 266 that protrudes from the surface of the susceptor 217. In this case, the detected position information that represents the wafer position being transferred in the first transfer chamber 103 is generated by the above-described substrate placing position calibration process and the position in which the first substrate transfer device 112 places the substrate on the plurality of substrate support units 217b is controlled based on the detected position information, the reference position information s1 and the substrate reference position information sk.

When the substrate 200 is loaded into the reaction container 203, the first substrate transfer device 112 is discharged outside the reaction container 203, the gate valve 151 is closed and an inside of the reaction container 203 is sealed. Then, the substrate lift pin 266 is lowered and the substrate 200 is placed on the substrate support unit 217b provided in the susceptor 217 of each of bottoms of the first processing region 201a, the first purge region 204a, the second processing region 201b and the second purge region 204b.

Also, when the substrate 200 is loaded into the reaction container 203, $N_2$ gas serving as a purge gas is preferably supplied into the reaction container 203 through the inert gas supply system while the inside of the reaction container 203 is exhausted by an exhaust unit. That is, while the vacuum pump 246 operates to open the APC valve 243 and the inside of the reaction container 203 is exhausted, $N_2$ gas is preferably supplied into the reaction container 203 by opening at least valve 234d of the first inert gas supply system. Accordingly, it is possible to suppress particles from being introduced into the processing region 201 and particles from being attached onto the substrate 200. Here, also, the inert gas may be supplied through a second inert gas supply system and a third inert gas supply system. Also, the vacuum pump 246 is continuously operated at least until the substrate loading and placing process (S102) to a substrate unloading process (S108) to be described below are completed.

[Temperature Rising and Pressure Regulating Process (S104)]

Next, the surface of the substrate 200 is heated to have a predetermined temperature (for example, 200° C. or more and 400° C. or less) by supplying power to the heater 218 that is embedded in the susceptor 217. In this case, the temperature of the heater 218 is regulated by controlling power supply to the heater 218 based on information on a temperature detected by the temperature sensor 274.

Also, in a heating process of the substrate 200 made of silicon, when a surface temperature is increased to 750° C. or more, impurities in a source area or a drain area formed on the surface of the substrate 200 are diffused. Therefore, circuit characteristics are degraded and the performance of the semiconductor device decreases in some cases. When a temperature of the substrate 200 is limited as described above, it is possible to suppress impurities of the source area or the drain area formed on the surface of the substrate 200 from diffusing, the degradation of circuit characteristics and the performance of the semiconductor device from decreasing.

Also, the inside of the reaction container 203 is vacuum-exhausted by the vacuum pump 246 so that the inside of the reaction container 203 is to have a desired pressure (for example, 0.1 Pa to 300 Pa and preferably, 20 Pa to 40 Pa). In this case, the pressure in the reaction container 203 is measured by a pressure sensor (not illustrated) and a degree of opening of the APC valve 243 is fed back and controlled based on measured pressure information.

Also, while the substrate 200 is heated, rotation of the susceptor 217 starts by operating the rotating mechanism 267. In this case, a rotation speed of the susceptor 217 is controlled by the control unit 300. The rotation speed of the susceptor 217 is, for example, 1 revolution per second. By rotating the susceptor 217, the substrate 200 starts to move sequentially to the first processing region 201a, the first purge region 204a, the second processing region 201b and the second purge region 204b and the substrate 200 passes through each region.

[Film Forming Process (S106)]

Next, an example in which a process of forming an SiO film on the substrate 200 by supplying TSA gas serving as the first processing gas into the first processing region 201a and oxygen gas serving as the second processing gas into the second processing region 201b will be described. Also, in the following description, TSA gas, oxygen gas and an inert gas are concurrently supplied into each of regions.

When the substrate 200 is heated to a desired temperature and the susceptor 217 reaches a desired rotation speed, at least the valve 232d, 233d or 234d is opened and supplies of the processing gas and the inert gas into the processing region 201 and the purge region 204 start. That is, the valve 232d is opened to supply TSA gas into the first processing region 201a, the valve 233d is opened to supply oxygen gas into the second processing region 201b and the valve 234d is opened to supply $N_2$ gas serving as an inert gas into the first purge region 204a and the second purge region 204b. In this case, by appropriately regulating the APC valve 243, a pressure in the reaction container 203 is set to a pressure, for example, in a range of 10 Pa to 1,000 Pa. In this case, the temperature of the heater 218 is set to a temperature in which the temperature of the substrate 200 is, for example, within a range of 200° C. to 400° C.

That is, while the valve 232d is opened to supply TSA gas into the first processing region 201a via the first processing gas inlet 251 and the first gas outlet 254 through the first gas supply pipe 232a, the valve 232d is exhausted through the exhaust pipe 231. In this case, the MFC 232c is regulated so that a flow rate of TSA gas becomes a predetermined flow rate. Also, a supply flow rate of TSA gas controlled by the MFC 232c is, for example, within a range of 100 sccm to 5,000 sccm.

When TSA gas is supplied into the first processing region 201a, the valve 235d is opened and $N_2$ gas serving as a carrier gas or a dilution gas is preferably supplied into the first processing region 201a through the second inert gas supply pipe 235a. Accordingly, it is possible to promote supply of TSA gas into the first processing region 201a.

Also, the valve 232d is opened and at the same time, while the valve 233d is opened to supply oxygen gas into the second processing region 201b via the second processing gas inlet 252 and the second gas outlet 255 through the second gas supply pipe 233a, the valve 233d is exhausted through the exhaust pipe 231. In this case, the MFC 233c is regulated so that a flow rate of oxygen gas becomes a predetermined flow rate. Also, a supply flow rate of oxygen gas controlled by the MFC 232c is, for example, within a range of 1,000 sccm to 10,000 sccm.

When oxygen gas is supplied into the second processing region 201b, the valve 236d is opened and $N_2$ gas serving as a carrier gas or a dilution gas is preferably supplied into the second processing region 201b through the third inert gas supply pipe 236a. Accordingly, it is possible to promote supply of oxygen gas into the second processing region 201b.

Also, the valve 232d and the valve 233d are opened and at the same time while the valve 234d is opened to supply $N_2$ gas that is an inert gas serving as a purge gas into the first purge region 204a and the second purge region 204b via the inert gas inlet 253, the first inert gas outlet 256 and the second inert gas outlet 257 through the first inert gas supply pipe 234a, the valve 234d is exhausted. In this case, the MFC 234c is regulated so that a flow rate of $N_2$ gas becomes a predetermined flow rate. Also, the inert gas is ejected from insides of the first purge region 204a and the second purge region 204b into the first processing region 201a and the second processing region 201b via a gap between an end of the partition plate 205 and a side wall of the reaction container 203. Accordingly, it is possible to suppress a processing gas from being introduced into the first purge region 204a and the second purge region 204b.

The gas supply starts and high frequency power is supplied from a high frequency power source (not illustrated) to the plasma generating unit 206 provided in an upper part in the second processing region 201b. The oxygen gas that is supplied into the second processing region 201b and passes through a lower part in the plasma generating unit 206 becomes a plasma state in the second processing region 201b and active species included in the oxygen gas are supplied to the substrate 200.

The oxygen gas has a high reaction temperature and thus it is difficult to react at a processing temperature of the substrate 200 and pressure in the reaction container 203 as described above. However, as in the present embodiment, when the oxygen gas becomes in a plasma state and active species included in the oxygen gas are supplied, a film formation may be performed at a temperature, for example, 400° C. or less. Also, when the processing temperatures required in the first processing gas and the second processing gas are different, the heater 218 is controlled based on the temperature of the processing gas at a side in which the processing temperature is low and the processing gas at the other side that is necessary to increase the processing temperature may be supplied in a plasma state. Using the plasma as describe above, the substrate 200 may be processed at a low temperature, and it is possible to suppress the substrate 200 including interconnections that are weak against heat, such as formed of aluminum or the like, from being heat-damaged. Also, it is possible to suppress a foreign material such as a product generated by the incomplete reaction of the processing gas from being generated, and thus it is possible to improve the uniformity or a withstand voltage characteristic of the thin film formed on the substrate 200. Also, due to a high oxidation of the oxygen gas in the plasma state, the productivity of the substrate processing such as the reduction of an oxidation processing time may be improved.

As described above, by rotating the susceptor 217, the substrate 200 repeats to move sequentially the first processing region 201a, the first purge region 204a, the second processing region 201b and the second purge region 204b. Accordingly, as illustrated in FIG. 9, in the substrate 200, supply of TSA gas (S202), supply of $N_2$ (purge) gas (S204), supply of oxygen gas in a plasma state (S206) and supply of $N_2$ (purge) gas (S208) are alternately performed a predetermined number of times. Here, a sequence of a film forming process will be described in detail with reference to FIG. 9.

[Pass Through First Processing Gas Region (S202)]

First, TSA gas is supplied onto the surface of the substrate 200 passing through the first processing region 201a and to a portion in which the substrate of the susceptor 217 is not placed and a silicon-containing layer is formed on the substrate 200.

[Pass Through First Purge Region (S204)]

Next, the substrate 200 on which the silicon-containing layer is formed passes through the first purge region 204a. In this case, $N_2$ gas that is an inert gas is supplied into the first purge region.

[Pass Through Second Processing Gas Region (S206)]

Next, oxygen gas is supplied onto the substrate 200 passing through the second processing region 201b and to the portion in which the substrate of the susceptor 217 is not placed. A silicon oxide layer (SiO layer) is formed on the substrate 200. That is, the oxygen gas reacts with a portion of the silicon-containing layer formed on the substrate 200 in the first processing region 201a. Accordingly, the silicon-containing layer is oxidized and modified to an SiO layer containing silicon and oxygen.

[Pass Through Second Purge Region (S208)]

Also, in the second processing region 201b, the substrate 200 in which the SiO layer is formed passes through the second purge region 204b. In this case, $N_2$ gas that is an inert gas is supplied into the second purge region 204b.

[Determination of Number of Cycles (S210)]

In this manner, one rotation of the susceptor 217 is referred to as one cycle, that is, one cycle means that the substrates 200 passes through the first processing region 201a, the first purge region 204a, the second processing region 201b and the second purge region 204b, and an SiO film having a predetermined film thickness may be formed on the substrates 200 by performing at least one or more cycles. Here, whether the above-described cycle is performed or not the predetermined number of times is determined. When the cycle is performed the predetermined number of times, it is determined that a desired film thickness reaches and the film formation is complete. When the cycle is not performed the predetermined number of times, it is determined that a desired film thickness does not reach and the cycle process is continued by returning to the process (S202).

In the process (S210), the above-described cycle is performed the predetermined number of times, it is determined that the SiO film having a desired film thickness is formed on the substrate 200 and then at least the valve 232d and the valve 233d are closed and the supplies of the TSA gas and the oxygen gas into the first processing region 201a and the second processing region 201b are stopped. In this case, power supply to the plasma generating unit 206 is also stopped. Also, a temperature is lowered by controlling an amount of power supply of the heater 218 or the power supply to the heater 218 is stopped. Also, the rotation of the susceptor 217 is stopped.

[Substrate Unloading Process (S108)]

When the film forming process (S106) is complete, the substrate is unloaded in the following manner. First, the substrate lift pin 266 is raised and the substrate 200 is supported on the substrate lift pin 266 that protrudes from the surface of the susceptor 217. Then, the gate valve 151 is opened, the substrate 200 is unloaded outside the reaction container 203 using the first substrate transfer device 112 and the substrate processing process according to the present embodiment is complete. Also, as described above, conditions such as the temperature of the substrate 200, the pressure in the reaction container 203, the flow rate of each gas, power applied to the plasma generating unit 206, a processing time and the like are arbitrarily regulated by a material or thickness of a film to be modified.

[Determination of the Number of Processing (S110)]

In a process (S110), whether a cycle of the substrate loading and placing process (S102) to the substrate unloading process (S108) is performed or not a predetermined number of times is determined. Here, the predetermined number of times refers to the number of times that becomes a state in which the cleaning is required as a result that the film formation is continued. The number of times is set by calculating the number of processes required the cleaning using a simulation or the like in advance.

[Cleaning Process (S112)]

After a cycle of the substrate loading and placing process (S102) to the substrate unloading process (S108) is performed a predetermined number of times, that is, in a state in which the processing substrate 200 is not placed on the susceptor 217, cleaning of the process chamber 202 is performed. Specifically, a process illustrated in FIG. 10 is performed.

[Dummy Substrate Loading and Placing Process (S302)]

When the dummy substrate 280 is placed in the same sequence as when the processing substrate is placed on the substrate support unit 217b of the susceptor 217.

[Temperature Rising and Pressure Regulating Process (S304)]

Next, power is supplied to the heater 218 embedded in the susceptor 217 and a surface of the dummy substrate 280 is heated to have a predetermined temperature.

Also, the inside of the reaction container 203 is vacuum-exhausted by the vacuum pump 246 so that the inside of the reaction container 203 is at a desired pressure (for example, 0.1 Pa to 300 Pa and preferably, 20 Pa to 40 Pa). In this case, the pressure in the reaction container 203 is measured by the pressure sensor (not illustrated) and a degree of opening of the APC valve 243 is fed back and controlled based on measured pressure information.

Also, while the dummy substrate 280 is heated, rotation of the susceptor 217 starts by operating the rotating mechanism 267. In this case, a rotation speed of the susceptor 217 is controlled by the control unit 300. The rotation speed of the susceptor 217 is, for example, 1 revolution per second. By rotating the susceptor 217, the dummy substrate 280 starts to move sequentially to the first processing region 201a, the first purge region 204a, the second processing region 201b and the second purge region 204b and the dummy substrate 280 passes through each region.

[Gas Supply Process (S306)]

Next, a cleaning gas is supplied into the reaction container 203 through the cleaning gas inlet 258. At the same time, a purge gas is supplied into each processing region.

As described above, the inside of the reaction container 203 is cleaned.

[Substrate Unloading Process (S308)]

After the cleaning process is performed for a predetermined time, the dummy substrate is unloaded in a reverse sequence.

(6) Effects According to the First Embodiment

According to the first embodiment, at least effect to be described below is obtained.

(a) The substrate deviation degree is detected during the substrate transferring along the substrate moving path and the position in which the substrate is placed on the substrate support unit in the process chamber is calibrated during the substrate transferring, based on the substrate deviation degree. Thus, the substrate placement position to the substrate support unit may be quickly calibrated compared to a case in which the substrate deviation degree is detected in the process chamber and the position in which the substrate is placed is calibrated.

(b) In advance, the substrate reference position information sk at the path unit reference position of the substrate transfer unit on the substrate moving path is obtained, and the substrate position at the path unit reference position during the substrate transferring for the substrate processing is detected to obtain the detected position information. Thus, the substrate deviation degree may be easily detected.

(c) The substrate detecting sensor for detecting the substrate deviation degree on the substrate moving path is provided in the transfer chamber adjacent to the process chamber. Thus, it is possible to suppress the surface of the sensor from forming a film compared to a case in which the sensor is provided in the process chamber and a replacement period or maintenance period of the sensor may be increased. Also, compared to a case in which the sensor is provided in each of the plurality of substrate support units in the process chamber, the number of sensors may be reduced.

(d) The substrate detecting sensor includes two substrate detecting sensors and the position of the substrate during the transferring is detected based on a time difference in which the substrate being transferred inside of the transfer chamber is detected by the two substrate detecting sensors. Thus, the detected position information on the substrate during the transferring may be easily obtained.

(e) Among the substrates being transferred in the transfer chamber, a position of the substrate transfer unit when at least two of the substrate detecting sensor detect the substrate becomes the path unit reference position. Thus, the substrate reference position information sk may be easily obtained.

(f) When the substrate deviation degree on the substrate moving path is within a predetermined range, a placement position to the substrate support unit is calibrated based on the substrate deviation degree and the substrate is placed. When the substrate deviation degree is out of the predetermined range, the transferring operation of the substrate transfer unit is stopped. Thus, it is possible to avoid a problem such as damage on the wafer when the substrate deviation degree is large. Also, when the predetermined range is appropriately set, it is possible to prevent the wafer from protruding from the substrate support unit.

(g) The substrate detecting sensor is provided in the vicinity of the process chamber in the transfer chamber on the substrate moving path. Thus, the substrate deviation degree may be further accurately detected compared to a case in which the substrate detecting sensor is provided in a portion other than the vicinity of the process chamber.

(h) By obtaining and using difference information on the reference position information s1 on the plurality of substrate support units 217b, the substrate reference position information sk may be further efficiently obtained in the process of obtaining the substrate reference position information sk.

Second Embodiment

Figure 11:
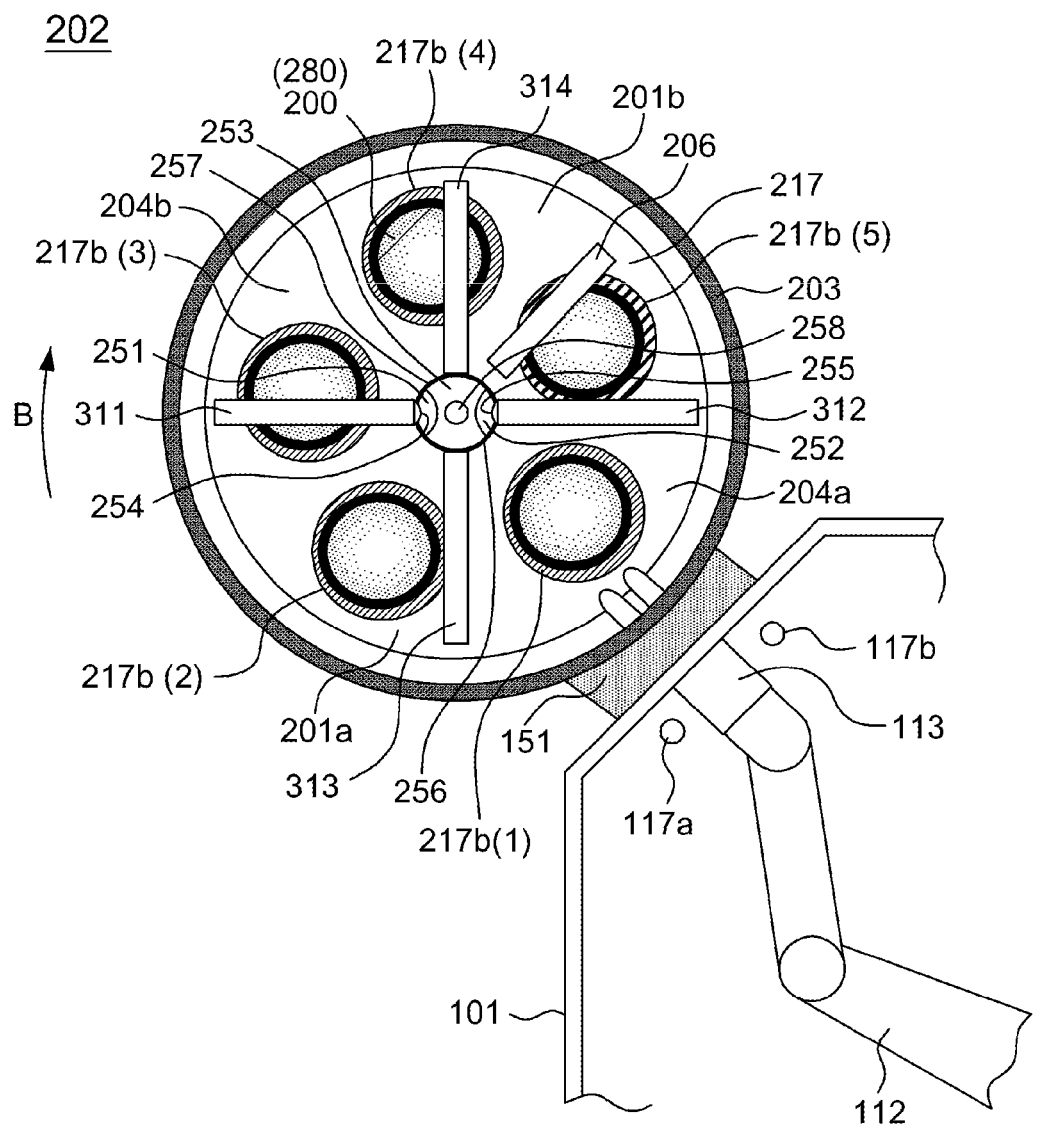
FIG. 11 is a top schematic view of a substrate process chamber according to a second embodiment of the present invention.

Next, a second embodiment of the present invention will be described with reference to FIG. 11. FIG. 11 is a top schematic view of a substrate process chamber according to the second embodiment.

(Apparatus Configuration)

A gas supply unit in a second embodiment is different from the first embodiment, but the other components having the same reference numerals are the same as those in the first embodiment. Hereinafter, the other configurations will be described. A reference numeral 311 is a first gas supply nozzle. The first gas supply nozzle 311 is connected to the first processing gas inlet 251 and extends in a direction of a diameter of the susceptor 217. A reference numeral 312 is a second gas supply nozzle. The second gas supply nozzle 312 is connected to the second processing gas inlet 252 and extends in the direction of the diameter of the susceptor 217. A reference numeral 313 is a first purge gas supply nozzle and a reference numeral 314 is a second purge gas supply nozzle. Each of the first purge gas supply nozzle and the second purge gas supply nozzle is connected to the inert gas inlet 253 and extends in the direction of the diameter of the susceptor 217.

A plurality of gas outlets are provided in each nozzle in the direction of the diameter of the susceptor 217. Also, it is configured so that the size of each nozzle becomes greater than a diameter of the substrate placed on the substrate support unit 217b, that is, gas is supplied to the entire substrate placed on the substrate support unit 217b. By the above-described configuration, the gas may be uniformly supplied onto the substrate 200. The partition plate 205 will not be illustrated in FIG. 11. Also, the configuration of the second embodiment may have or not have the partition plate 205.

[Substrate Processing Process]

The substrate processing process is substantially similar to that in the first embodiment, but in the film forming process or the cleaning process, the processing gas or the purge gas is supplied through a gas supply nozzle 311 instead of the first gas outlet 254 and a gas supply nozzle 312 instead of the second gas outlet 255. Also, the purge gas is supplied through a purge gas supply nozzle 313 and a purge gas supply nozzle 314 instead of the first inert gas outlet 256 and the second inert gas outlet 257.

Other Embodiments of the Present Invention

While the embodiments of the present invention have been specifically described above, the present invention is not limited to the above-described embodiments, and may be variously modified without departing from the scope of the invention.

For example, in the above-described embodiment, the SiO film was formed on the substrate 200 using silicon-containing gas or oxygen-containing gas serving as a processing gas, but is not limited thereto. That is, a high-k film such as a hafnium oxide film (HfO film), a zirconium oxide film (ZrO film), a film of titanium oxide (TiO film) or the like may be formed on the substrate 200, for example, using a gas containing hafnium (Hf), oxygen-containing gas, a gas containing zirconium (Zr), oxygen-containing gas, a gas containing titanium (Ti) and oxygen-containing gas serving as a processing gas. Also, as a plasmatized processing gas, ammonia (NH3) gas or the like that is a gas containing nitrogen (N) rather than oxygen-containing gas may be used.

Also, in the above-described embodiment, the oxygen gas was supplied into the process chamber and the plasma was generated in the plasma generating unit 206, but is not limited thereto. A remote plasma method in which plasma is generated outside the process chamber or ozone having a high energy level may be used.

Also, in the above-described embodiment, the inert gas inlet 253 of the gas supply unit 250 were commonly provided in the first purge region 204a and the second purge region 204b, but the inert gas inlet may be individually provided.

Also, in the above-described embodiment, the substrate 200 is moved to the processing position or the transferring position by raising the substrate lift pin 266, but the substrate 200 may be moved to the processing position or the transferring position by raising the susceptor 217 using the lifting mechanism 268.

Also, in the above-described embodiment, the substrate 200 was the wafer having a circular shape, but it may be configured to have a substrate having a rectangular shape.

Also, in the above-described embodiment, a plurality of substrate support units 217b were provided in the one susceptor 217, but it may be configured that the one substrate support unit 217b is provided in the one susceptor 217. Also, it may be configured that the wafer is directly placed on the susceptor 217 without providing the substrate support unit 217b.

Also, in the above-described embodiment, a substrate deviation degree on the substrate moving path was detected using two transmission sensors serving as substrate detecting units, but it may be configured to use three or more transmission sensors. Also, it may be configured to use reflective sensors rather than the transmission sensors. Also, it may be configured to use ultrasonic sensors rather than the optical sensors. Also, it may be configured to detect the substrate deviation degree on the substrate moving path using imaging cameras.

According to the configuration, a substrate can be placed at a predetermined position on a susceptor even though the substrate that is supported on tweezers is deviated.

Preferred Embodiments of the Present Invention

Hereinafter, preferred embodiments according to the present invention are supplementarily noted.

<Supplementary Note 1>

According to an aspect of the present invention, there is provided a substrate processing apparatus including:

a process chamber accommodating a substrate support and a rotating mechanism configured to rotate the substrate support, the substrate support including a first substrate support unit and a second substrate support unit arranged along a circumference of the substrate support and configured to place a first substrate and a second substrate thereon, respectively, wherein the first substrate and the second substrate are processed while being placed on the first substrate support unit and the second substrate support unit in the process chamber;

a transfer chamber disposed adjacent to the process chamber, the transfer chamber accommodating a substrate transfer unit configured to transfer and place the first substrate and the second substrate on the first substrate support unit and the second substrate support unit, respectively;

a substrate detecting unit configured to detect whether a substrate is present at a predetermined position in the transfer chamber;

a memory unit configured to store a first reference position information, a second reference position information and a substrate reference position information, wherein the first reference position information represents a first reference position corresponding to a reference position of the substrate transfer unit when the first substrate is placed on the first substrate support unit, the second reference position information represents a second reference position corresponding to a reference position of the substrate transfer unit when the second substrate is placed on the second substrate support unit, and the substrate reference position information represents a reference position of the first substrate and the second substrate in the transfer chamber along a transfer path of the first substrate and the second substrate; and a controller configured to generate a detected position information representing a position of a third substrate being transferred in the transfer chamber based on a detection result provided by the substrate detecting unit and to control the substrate transfer unit to place the third substrate on the second substrate support unit based on the detected position information, the first reference position information, the substrate reference position information and a difference between the first reference position information and the second reference position information.

<Supplementary Note 2>

In the substrate processing apparatus of Supplementary note 1, preferably, the controller is further configured to calibrate a position where the third substrate is placed based on a difference between the detected position information and the substrate reference position information when the difference between the detected position information and the substrate reference position information is within a predetermined range.

<Supplementary Note 3>

In the substrate processing apparatus of Supplementary note 2, preferably, the controller is further configured to stop the substrate transfer unit from transferring the third substrate when the difference between the detected position information and the substrate reference position information is out of the predetermined range.

<Supplementary Note 4>

In the substrate processing apparatus of any one of Supplementary notes 1 through 3, preferably, the substrate detecting unit includes at least two substrate detectors, and the controller is further configured to generate the detected position information based on a difference between timepoints at which the third substrate being transferred in the transfer chamber is detected by the at least two substrate detectors.

<Supplementary Note 5>

In the substrate processing apparatus of Supplementary note 4, preferably, the controller is further configured to assign a position of the first substrate or the second substrate as the substrate reference position information when the first substrate or the second substrate is detected by the at least two substrate detectors.

<Supplementary Note 6>

According to another aspect of the present invention, there is provided a method of manufacturing a semiconductor device using a substrate processing apparatus including: a process chamber accommodating a substrate support and a rotating mechanism configured to rotate the substrate support, the substrate support including a first substrate support unit and a second substrate support unit arranged along a circumference of the substrate support and configured to place a first substrate and a second substrate thereon, respectively; a transfer chamber disposed adjacent to the process chamber, the transfer chamber accommodating a substrate transfer unit configured to transfer and place the first substrate and the second substrate on the first substrate support unit and the second substrate support unit, respectively; and a substrate detecting unit configured to detect whether a substrate is present at a predetermined position in the transfer chamber, the method including:

(a) obtaining a first reference position information and a second reference position information, wherein the first reference position information represents a first reference position corresponding to a reference position of the substrate transfer unit when the first substrate is placed on the first substrate support unit, and the second reference position information represents a second reference position corresponding to a reference position of the substrate transfer unit when the second substrate is placed on the second substrate support unit;

(b) obtaining a substrate reference position information representing a reference position of the first substrate and the second substrate in the transfer chamber along a transfer path of the first substrate and the second substrate;

(c) detecting a position of a third substrate being transferred in the transfer chamber based on a detection result provided by the substrate detecting unit;

(d) placing the third substrate on the first substrate support unit based on a detected position information representing the position of the third substrate detected in the step (c), the first reference position information and the substrate reference position information;

(e) detecting a position of a fourth substrate being transferred in the transfer chamber based on a detection result provided by the substrate detecting unit;

(f) placing the fourth substrate on the second substrate support unit based on a detected position information representing the position of the fourth substrate detected in the step (e), the first reference position information, the substrate reference position information and a difference between the first reference position information and the second reference position information; and (g) forming semiconductor devices on the third substrate and the fourth substrate placed on the first substrate support unit and the second substrate support unit, respectively.

<Supplementary Note 7>

According to still another aspect of the present invention, there is provided a method of manufacturing a semiconductor device including:

(a) obtaining a support unit reference position information representing a reference position of a substrate transfer unit when a first substrate is placed on the substrate support unit configured to place the first substrate thereon;

(b) obtaining a substrate reference position information representing a reference position of the first substrate along a transfer path of the first substrate;

(c) detecting a position of a second substrate being transferred to the substrate support unit;

(d) placing the second substrate on the substrate support unit based on a detected position information representing the position of the second substrate detected in the step (c), the support unit reference position information and the substrate reference position information; and (e) forming a semiconductor device on the second substrate placed on the substrate support unit.

<Supplementary Note 8>

According to still another aspect of the present invention, there is provided a substrate processing apparatus including:

a process chamber accommodating a first substrate support unit and a second substrate support unit configured to place a first substrate and a second substrate thereon, respectively, wherein the first substrate and the second substrate are processed while being placed on the first substrate support unit and the second substrate support unit in the process chamber;

a transfer chamber disposed adjacent to the process chamber, the transfer chamber accommodating a substrate transfer unit configured to transfer and place the first substrate and the second substrate on the first substrate support unit and the second substrate support unit, respectively;

a substrate detecting unit configured to detect whether a substrate is present at a predetermined position in the transfer chamber;

a memory unit configured to store a first reference position information, a second reference position information and a substrate reference position information, wherein the first reference position information represents a first reference position corresponding to a reference position of the substrate transfer unit when the first substrate is placed on the first substrate support unit, the second reference position information represents a second reference position corresponding to a reference position of the substrate transfer unit when the second substrate is placed on the second substrate support unit, and the substrate reference position information represents a reference position of the first substrate and the second substrate in the transfer chamber along a transfer path of the first substrate and the second substrate; and a controller configured to generate a detected position information representing a position of a third substrate being transferred in the transfer chamber based on a detection result provided by the substrate detecting unit and to control the substrate transfer unit to place the third substrate on the second substrate support unit based on the detected position information, the first reference position information, the substrate reference position information and a difference between the first reference position information and the second reference position information.

<Supplementary Note 9>

According to still another aspect of the present invention, there is provided a substrate processing apparatus including:

a process chamber accommodating a substrate support and a rotating mechanism configured to rotate the substrate support, the substrate support including a first substrate support unit through an $n^{th}$ substrate support unit arranged along a circumference of the substrate support and configured to place a first substrate through an $n^{th}$ substrate thereon, respectively, wherein the first substrate through the $n^{th}$ substrate are processed while being placed on the first substrate support unit through the $n^{th}$ substrate support unit in the process chamber, wherein n is a natural number equal to or greater than two;

a transfer chamber disposed adjacent to the process chamber, the transfer chamber accommodating a substrate transfer unit configured to transfer and place the first substrate through the $n^{th}$ substrate on the first substrate support unit through the $n^{th}$ substrate support unit, respectively;

a memory unit configured to store a support unit reference position information representing a first reference position through an $n^{th}$ reference position corresponding to reference positions of the substrate transfer unit when the first substrate through the $n^{th}$ substrate are placed on the first substrate support unit through the $n^{th}$ substrate support unit, respectively; and a controller configured to control the substrate transfer unit based on the support unit reference position information.

<Supplementary Note 10>

In the substrate processing apparatus of Supplementary note 9, preferably, the transfer chamber further accommodates a substrate detecting unit configured to detect whether a substrate is present at a predetermined position in the transfer chamber, the memory unit is further configured to store a substrate reference position information representing reference positions of the first substrate through the $n^{th}$ substrate in the transfer chamber along a transfer path of the first substrate through the $n^{th}$ substrate, and the controller is further configured to generate a detected position information representing a position of the substrate being transferred in the transfer chamber based on detection results provided by the substrate detecting unit and to calibrate a position where the substrate is placed on one of the first substrate support unit through the $n^{th}$ substrate support unit based on a difference between the detected position information and the substrate reference position information when the difference between the detected position information and the substrate reference position information is within a predetermined range.

<Supplementary Note 11>

In the substrate processing apparatus of Supplementary note 10, preferably, the controller is further configured to stop the substrate transfer unit from transferring the substrate when the difference between the detected position information and the substrate reference position information is out of the predetermined range.

<Supplementary Note 12>

According to still another aspect of the present invention, there is provided a substrate processing apparatus including:

a process chamber accommodating a substrate support and a rotating mechanism configured to rotate the substrate support, the substrate support including a plurality of substrate support units arranged along a circumference of the substrate support and configured to place a plurality of substrates thereon, wherein the plurality of substrates are processed while being placed on the plurality of substrate support units in the process chamber;

a transfer chamber disposed adjacent to the process chamber, the transfer chamber accommodating a substrate transfer unit configured to transfer and place the plurality of substrates on the plurality of substrate support units;

a substrate detecting unit configured to detect whether a substrate is present at a predetermined position in the transfer chamber;

a memory unit configured to store a support unit reference position information and a substrate reference position information, wherein the support unit reference position information represents reference positions of the substrate transfer unit when the plurality of substrates are placed on the plurality of substrate support units, and the substrate reference position information represents reference positions of the plurality of substrates in the transfer chamber along a transfer path of the plurality of substrates; and a controller configured to generate a detected position information representing a position of the substrate being transferred in the transfer chamber based on a detection result provided by the substrate detecting unit and to control the substrate transfer unit to place the substrate on one of the plurality of substrate support units based on the detected position information, the support unit reference position information and the substrate reference position.

<Supplementary Note 13>

According to still another aspect of the present invention, there is provided a substrate processing apparatus including:

a process chamber accommodating a substrate support configured to place a first substrate and a rotating mechanism configured to rotate the substrate support, wherein the first substrate is processed while being placed on the substrate support in the process chamber;

a transfer chamber disposed adjacent to the process chamber, the transfer chamber accommodating a substrate transfer unit configured to transfer and place the first substrate on the substrate support;

a substrate detecting unit configured to detect whether a second substrate is present at a predetermined position in the transfer chamber;

a memory unit configured to store a support unit reference position information and a substrate reference position information, wherein the support unit reference position information represents a reference position of the substrate transfer unit when the first substrate is placed on the substrate support, and the substrate reference position information represents a reference position of the first substrate in the transfer chamber along a transfer path of the first substrate; and a controller configured to generate a detected position information representing a position of the second substrate being transferred in the transfer chamber based on a detection result provided by the substrate detecting unit and to control the substrate transfer unit to place the second substrate on the substrate support based on the detected position information, the support unit reference position information and the substrate reference position.

<Supplementary Note 14>

According to still another aspect of the present invention, there is provided a method of manufacturing a semiconductor device using a substrate processing apparatus including: a process chamber accommodating a substrate support and a rotating mechanism configured to rotate the substrate support, the substrate support including a plurality of substrate support units arranged along a circumference of the substrate support and configured to place a plurality of substrates thereon; a transfer chamber accommodating a substrate transfer unit configured to transfer and place the plurality of substrates on the plurality of substrate support units; and a substrate detecting unit configured to detect whether a substrate is present at a predetermined position in the transfer chamber; the method including:

(a) obtaining a support unit reference position information representing reference positions of the substrate transfer unit when the plurality of substrates are placed on the plurality of substrate support units;

(b) obtaining a substrate reference position information representing a reference positions of the plurality of substrates in the transfer chamber along a transfer path of the plurality of substrates;

(c) detecting a position of the substrate being transferred to the substrate support unit;

(d) placing the substrate on one of the plurality of substrate support units based on a detected position information representing the position of the substrate detected in the step (c), the support unit reference position information and the substrate reference position information; and (e) forming a semiconductor device on the substrate placed on the one of the plurality of substrate support units.

<Supplementary Note 15>

According to still another aspect of the present invention, there is provided a program causing a computer to perform:

(a) obtaining a support unit reference position information representing a reference position of a substrate transfer unit when a first substrate is placed on the substrate support unit configured to place the first substrate thereon;

(b) obtaining a substrate reference position information representing a reference position of the first substrate along a transfer path of the first substrate;

(c) detecting a position of a second substrate being transferred to the substrate support unit;

(d) placing the second substrate on the substrate support unit based on a detected position information representing the position of the second substrate detected in the sequence (c), the support unit reference position information and the substrate reference position information; and (e) forming a semiconductor device on the second substrate placed on the substrate support unit.

<Supplementary Note 16>

According to still another aspect of the present invention, there is provided a non-transitory computer-readable recording medium storing a program causing a computer to perform:

(a) obtaining a support unit reference position information representing a reference position of a substrate transfer unit when a first substrate is placed on the substrate support unit configured to place the first substrate thereon;

(b) obtaining a substrate reference position information representing a reference position of the first substrate along a transfer path of the first substrate;

(c) detecting a position of a second substrate being transferred to the substrate support unit;

(d) placing the second substrate on the substrate support unit based on a detected position information representing the position of the second substrate detected in the sequence (c), the support unit reference position information and the substrate reference position information; and (e) forming a semiconductor device on the second substrate placed on the substrate support unit.

What is claimed is:

1. A substrate processing apparatus comprising:
a process chamber accommodating a substrate support and a rotating mechanism configured to rotate the substrate support, the substrate support including a first substrate support unit and a second substrate support unit arranged along a circumference of the substrate support and configured to place a first substrate and a second substrate thereon, respectively, wherein the first substrate and the second substrate are processed while being placed on the first substrate support unit and the second substrate support unit in the process chamber;
a transfer chamber disposed adjacent to the process chamber, the transfer chamber accommodating a substrate transfer unit configured to transfer and place the first substrate and the second substrate on the first substrate support unit and the second substrate support unit, respectively;
a substrate detecting unit configured to detect whether a substrate is present at a predetermined position in the transfer chamber;
a memory unit configured to store a first reference position information, a second reference position information and a substrate reference position information, wherein the first reference position information represents a first position of the substrate transfer unit when the first substrate is placed on the first substrate support unit during a first teaching process, the second reference position information represents a second position of the substrate transfer unit when the second substrate is placed on the second substrate support unit during a second teaching process, and the substrate reference position information represents positions of the first substrate and the second substrate in the transfer chamber along a transfer path of the first substrate and the second substrate; and
a controller configured to generate a detected position information representing a position of a third substrate being transferred in the transfer chamber based on a detection result provided by the substrate detecting unit and to control the substrate transfer unit to place the third substrate on the second substrate support unit during a substrate processing process based on the detected position information, the first reference position information, the substrate reference position information and a difference between the first reference position information and the second reference position information.

2. The substrate processing apparatus of claim 1, wherein the controller is further configured to calibrate a position where the third substrate is placed based on a difference between the detected position information and the substrate reference position information when the difference between the detected position information and the substrate reference position information is within a predetermined range.

3. The substrate processing apparatus of claim 2, wherein the controller is further configured to stop the substrate transfer unit from transferring the third substrate when the difference between the detected position information and the substrate reference position information is out of the predetermined range.

4. The substrate processing apparatus of claim 1, wherein the substrate detecting unit comprises at least two substrate detectors, and the controller is further configured to generate the detected position information based on a difference between timepoints at which the third substrate being transferred in the transfer chamber is detected by the at least two substrate detectors.

5. The substrate processing apparatus of claim 4, wherein the controller is further configured to assign a position of the first substrate or the second substrate as the substrate reference position information when the first substrate or the second substrate is detected by the at least two substrate detectors.

6. A method of manufacturing a semiconductor device using a substrate processing apparatus comprising: a process chamber accommodating a substrate support and a rotating mechanism configured to rotate the substrate support, the substrate support including a first substrate support unit and a second substrate support unit arranged along a circumference of the substrate support and configured to place a first substrate and a second substrate thereon, respectively; a transfer chamber disposed adjacent to the process chamber, the transfer chamber accommodating a substrate transfer unit configured to transfer and place the first substrate and the second substrate on the first substrate support unit and the second substrate support unit, respectively; and a substrate detecting unit configured to detect whether a substrate is present at a predetermined position in the transfer chamber, the method comprising:
  (a) obtaining a first reference position information and a second reference position information, wherein the first reference position information represents a first position of the substrate transfer unit when the first substrate is placed on the first substrate support unit during a first teaching process, and the second reference position information represents a second position of the substrate transfer unit when the second substrate is placed on the second substrate support unit during a second teaching process;
  (b) obtaining a substrate reference position information representing positions of the first substrate and the second substrate in the transfer chamber along a transfer path of the first substrate and the second substrate;
  (c) detecting a position of a third substrate being transferred in the transfer chamber based on a detection result provided by the substrate detecting unit;
  (d) placing the third substrate on the first substrate support unit during a substrate processing process based on a detected position information representing the position of the third substrate detected in the step (c), the first reference position information and the substrate reference position information;
  (e) detecting a position of a fourth substrate being transferred in the transfer chamber based on a detection result provided by the substrate detecting unit;
  (f) placing the fourth substrate on the second substrate support unit during the substrate processing process based on a detected position information representing the position of the fourth substrate detected in the step (e), the first reference position information, the substrate reference position information and a difference between the first reference position information and the second reference position information; and
  (g) forming semiconductor devices on the third substrate and the fourth substrate placed on the first substrate support unit and the second substrate support unit, respectively.

7. The method of claim 6, further comprising calibrating a position where the fourth substrate is placed based on a difference between the detected position information representing the position of the fourth substrate detected in the step (e) and the substrate reference position information when the difference between the detected position information representing the position of the fourth substrate detected in the step (e) and the substrate reference position information is within a predetermined range.

8. The method of claim 6, further comprising stopping the substrate transfer unit from transferring the fourth substrate when the difference between the detected position information representing the position of the fourth substrate detected in the step (e) and the substrate reference position information is out of the predetermined range.

9. The method of claim 6, wherein the substrate detecting unit comprises at least two substrate detectors, and further comprising generating the detected position information representing the position of the fourth substrate detected in the step (e) based on a difference between timepoints at which the fourth substrate being transferred in the transfer chamber is detected by the at least two substrate detectors.

10. The method of claim 6, further comprising assigning a position of the first substrate or the second substrate as the substrate reference position information when the first substrate or the second substrate is detected by at least two substrate detectors.

11. A non-transitory computer-readable recording medium storing a program causing a substrate processing apparatus comprising: a process chamber accommodating a substrate support and a rotating mechanism configured to rotate the substrate support, the substrate support including a first substrate support unit and a second substrate support unit arranged along a circumference of the substrate support and configured to place a first substrate and a second substrate thereon, respectively; a transfer chamber disposed adjacent to the process chamber, the transfer chamber accommodating a substrate transfer unit configured to transfer and place the first substrate and the second substrate on the first substrate support unit and the second substrate support unit, respectively; and a substrate detecting unit configured to detect whether a substrate is present at a predetermined position in the transfer chamber, to perform:
  (a) obtaining a first reference position information and a second reference position information, wherein the first reference position information represents a first position of the substrate transfer unit when the first substrate is placed on the first substrate support unit during a first teaching process, and the second reference position information represents a second position of the substrate transfer unit when the second substrate is placed on the second substrate support unit during a second teaching process;
  (b) obtaining a substrate reference position information representing positions of the first substrate and the second substrate in the transfer chamber along a transfer path of the first substrate and the second substrate;
  (c) detecting a position of a third substrate being transferred in the transfer chamber based on a detection result provided by the substrate detecting unit;
  (d) placing the third substrate on the first substrate support unit during a substrate processing process based on a detected position information representing the position of the third substrate detected in the sequence (c), the first reference position information and the substrate reference position information;

(e) detecting a position of a fourth substrate being transferred in the transfer chamber based on a detection result provided by the substrate detecting unit;

(f) placing the fourth substrate on the second substrate support unit during the substrate processing process based on a detected position information representing the position of the fourth substrate detected in the sequence (e), the first reference position information, the substrate reference position information and a difference between the first reference position information and the second reference position information; and (g) forming semiconductor devices on the third substrate and the fourth substrate placed on the first substrate support unit and the second substrate support unit, respectively.

12. The non-transitory computer-readable recording medium of claim 11, the program causing the substrate processing apparatus to further perform: calibrating a position where the fourth substrate is placed based on a difference between the detected position information representing the position of the fourth substrate detected in the sequence (e) and the substrate reference position information when the difference between the detected position information representing the position of the fourth substrate detected in the sequence (e) and the substrate reference position information is within a predetermined range.

13. The non-transitory computer-readable recording medium of claim 11, the program causing the substrate processing apparatus to further perform: stopping the substrate transfer unit from transferring the fourth substrate when the difference between the detected position information representing the position of the fourth substrate detected in the sequence (e) and the substrate reference position information is out of the predetermined range.

14. The non-transitory computer-readable recording medium of claim 11, wherein the substrate detecting unit comprises at least two substrate detectors, and the program causes the substrate processing apparatus to further perform: generating the detected position information representing the position of the fourth substrate detected in the sequence (e) based on a difference between timepoints at which the fourth substrate being transferred in the transfer chamber is detected by the at least two substrate detectors.

15. The non-transitory computer-readable recording medium of claim 11, the program causing the substrate processing apparatus to further perform: assigning a position of the first substrate or the second substrate as the substrate reference position information when the first substrate or the second substrate is detected by at least two substrate detectors.

* * * * *